(12) United States Patent
Bangsaruntip et al.

(10) Patent No.: US 8,809,131 B2
(45) Date of Patent: Aug. 19, 2014

(54) REPLACEMENT GATE FIN FIRST WIRE LAST GATE ALL AROUND DEVICES

(75) Inventors: Sarunya Bangsaruntip, Mount Kisco, NY (US); Josephine B. Chang, Mahopac, NY (US); Isaac Lauer, Yorktown Heights, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 7 days.

(21) Appl. No.: 13/550,861

(22) Filed: Jul. 17, 2012

(65) Prior Publication Data
US 2014/0021538 A1 Jan. 23, 2014

(51) Int. Cl.
*H01L 21/335* (2006.01)

(52) U.S. Cl.
USPC ............................. 438/142; 257/331; 257/347

(58) Field of Classification Search
USPC .................................. 257/331, 347; 438/142
See application file for complete search history.

(56) References Cited

U.S. PATENT DOCUMENTS

| | | | |
|---|---|---|---|
| 7,060,539 B2* | 6/2006 | Chidambarrao et al. | 438/142 |
| 7,374,986 B2* | 5/2008 | Kim et al. | 438/193 |
| 2006/0091481 A1* | 5/2006 | Li et al. | 257/401 |
| 2011/0012090 A1* | 1/2011 | Singh et al. | 257/24 |
| 2011/0020987 A1* | 1/2011 | Hareland et al. | 438/151 |

* cited by examiner

*Primary Examiner* — David Vu
*Assistant Examiner* — Brandon Fox
(74) *Attorney, Agent, or Firm* — Louis J. Percello; Michael J. Chang, LLC

(57) ABSTRACT

In one aspect, a method of fabricating a nanowire FET device includes the following steps. A wafer is provided. At least one sacrificial layer and silicon layer are formed on the wafer in a stack. Fins are patterned in the stack. Dummy gates are formed over portions of the fins which will serve as channel regions, and wherein one or more portions of the fins which remain exposed will serve as source and drain regions. A gap filler material is deposited surrounding the dummy gates and planarized. The dummy gates are removed forming trenches in the gap filler material. Portions of the silicon layer (which will serve as nanowire channels) are released from the fins within the trenches. Replacement gates are formed within the trenches that surround the nanowire channels in a gate all around configuration. A nanowire FET device is also provided.

26 Claims, 15 Drawing Sheets

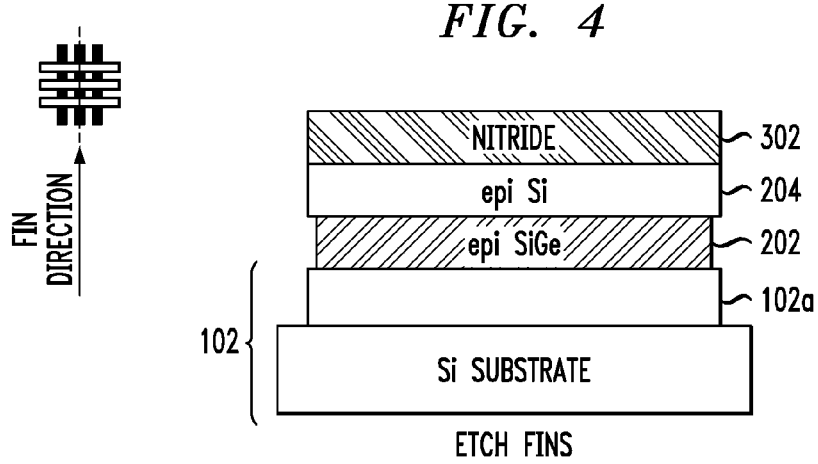
FIG. 4 ETCH FINS
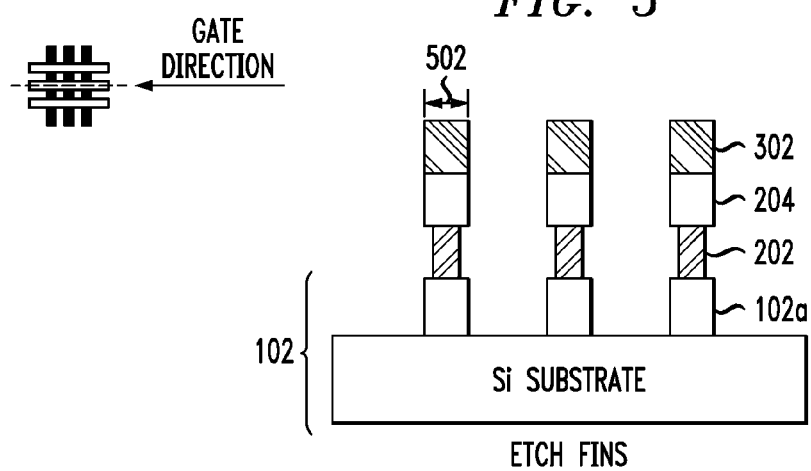
FIG. 5 ETCH FINS
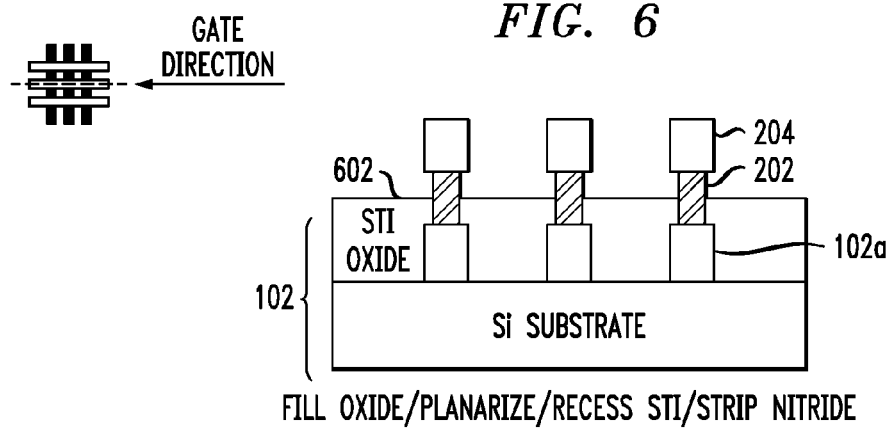
FIG. 6 FILL OXIDE/PLANARIZE/RECESS STI/STRIP NITRIDE

DUMMY GATE DEP, PLANARIZATION, HARDMASK

DUMMY GATE PATTERNING

DUMMY GATE PATTERNING

DUMMY GATE PATTERNING

SPACER epi RSD

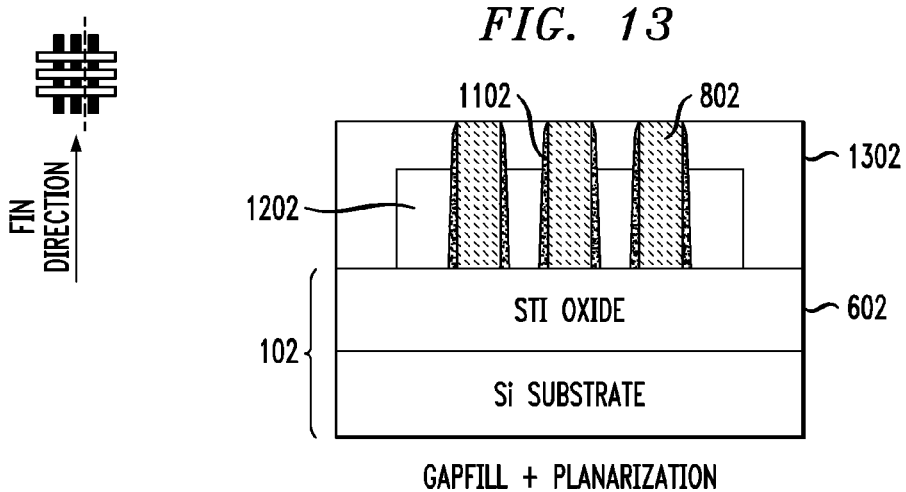
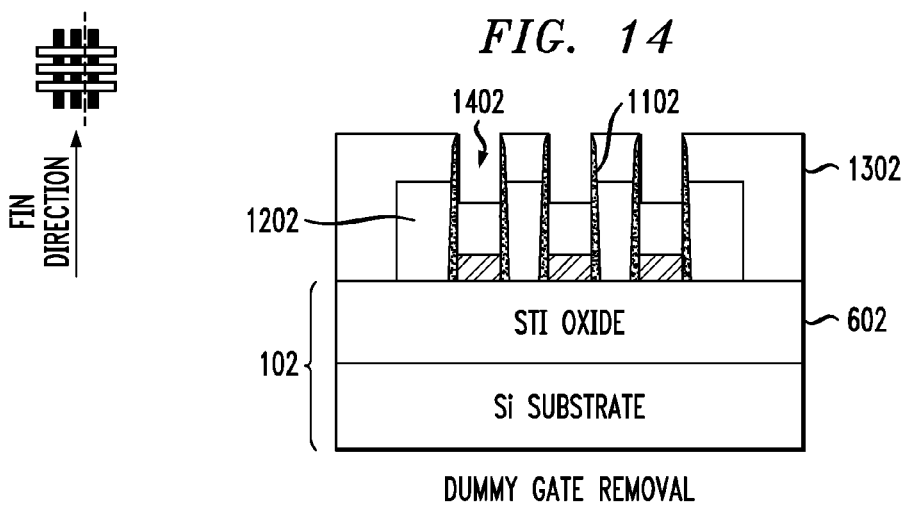
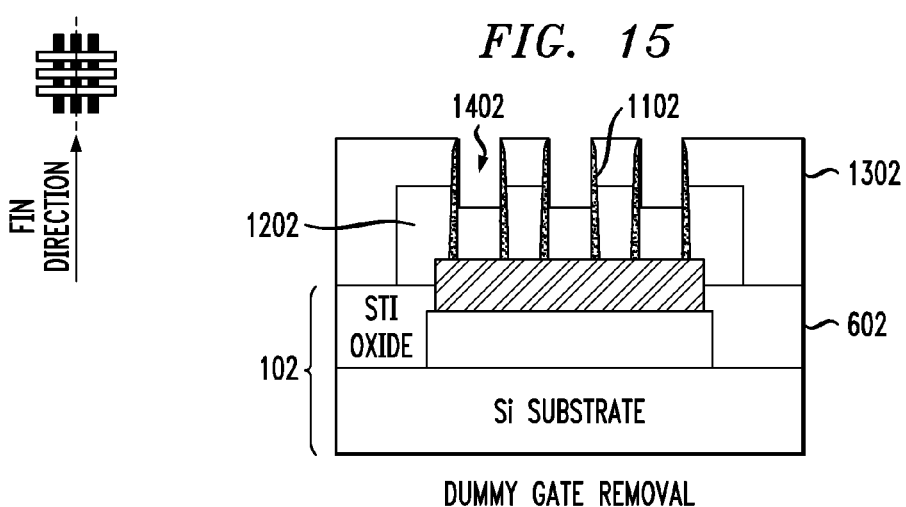

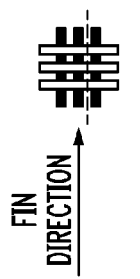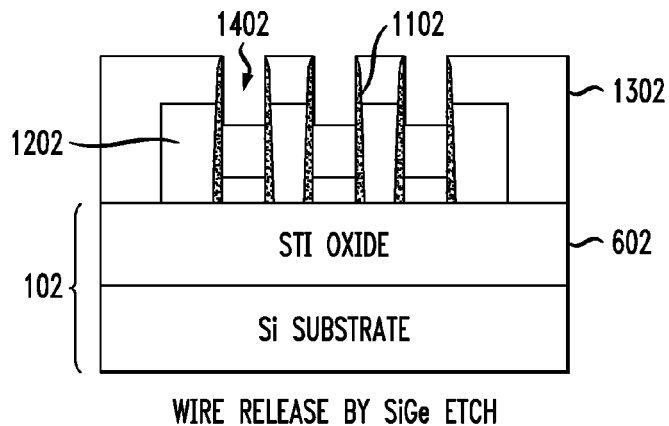
FIG. 16
WIRE RELEASE BY SiGe ETCH
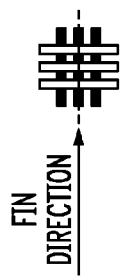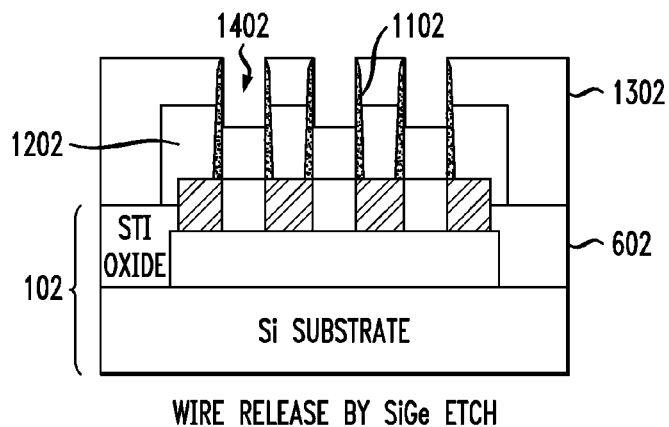
FIG. 17
WIRE RELEASE BY SiGe ETCH
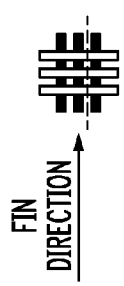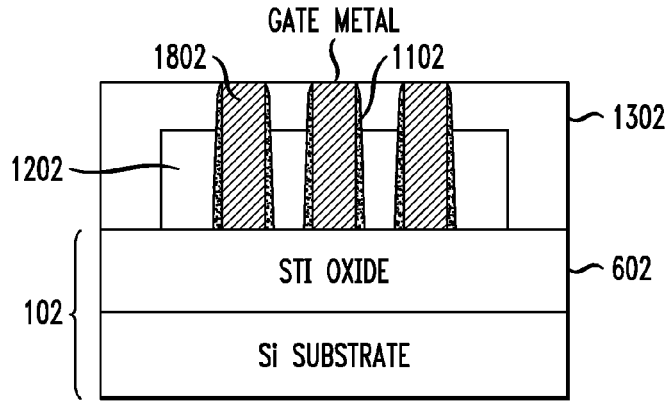
FIG. 18
GATE STACK + PLANARIZATION

GATE STACK + PLANARIZATION

STARTING SOI

GROW SiGe

CONDENSE SiGe

GROW Si

ETCH FINS

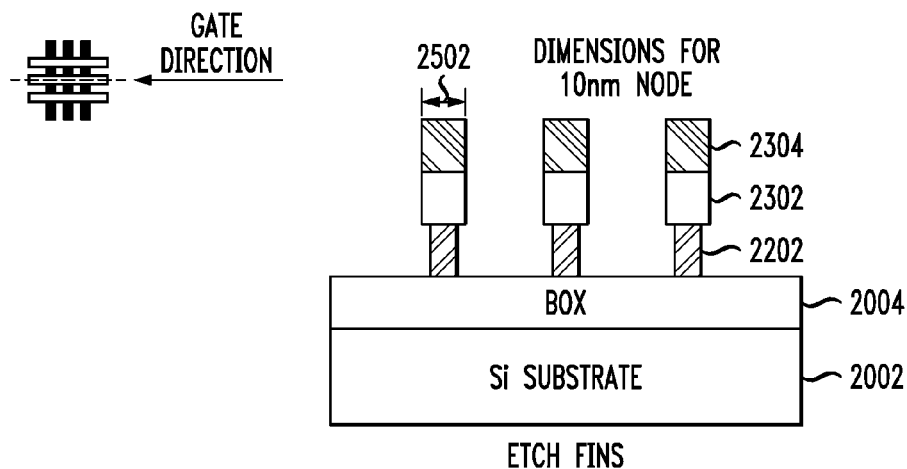
FIG. 25 ETCH FINS
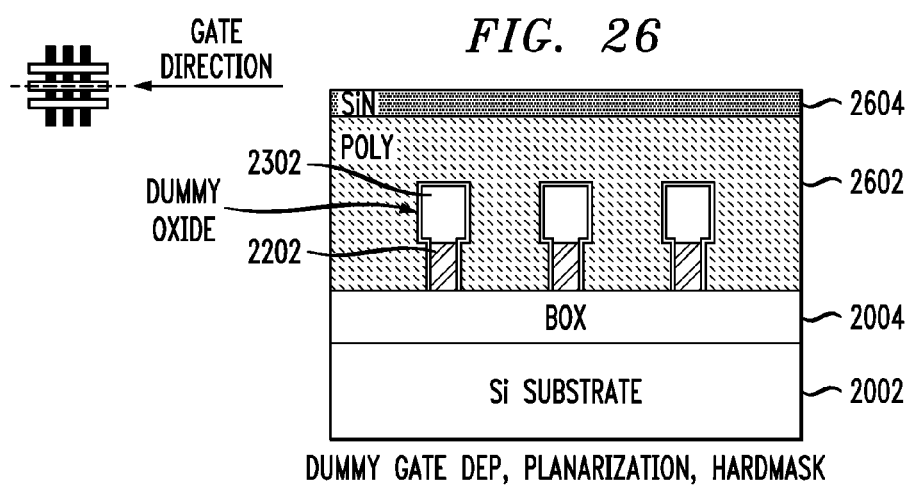
FIG. 26 DUMMY GATE DEP, PLANARIZATION, HARDMASK
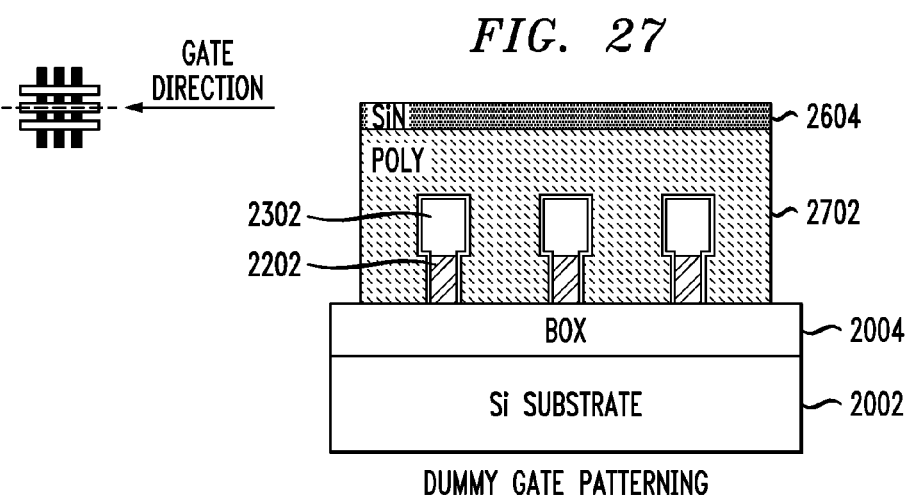
FIG. 27 DUMMY GATE PATTERNING

DUMMY GATE PATTERNING

DUMMY GATE PATTERNING

SPACER epi RSD

GAPFILL + PLANARIZATION

DUMMY GATE REMOVAL

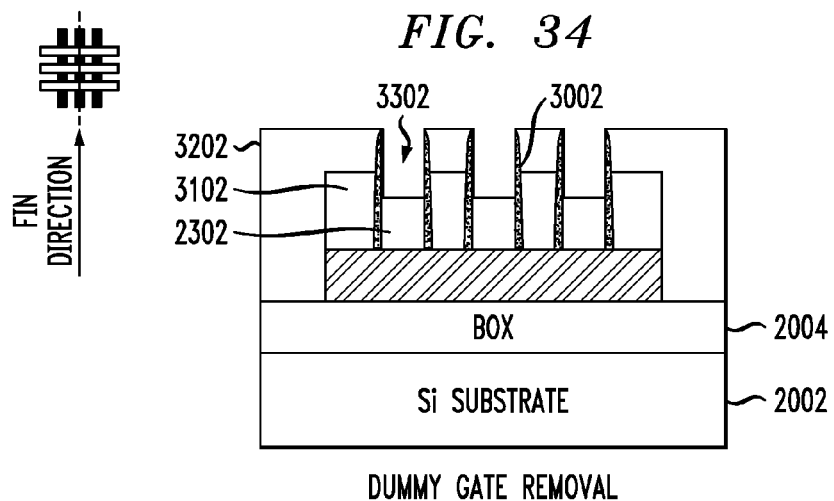
FIG. 34 — DUMMY GATE REMOVAL
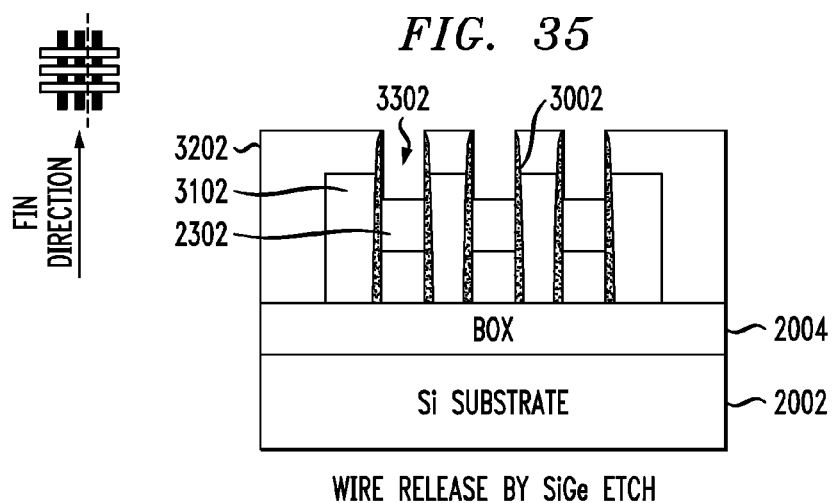
FIG. 35 — WIRE RELEASE BY SiGe ETCH
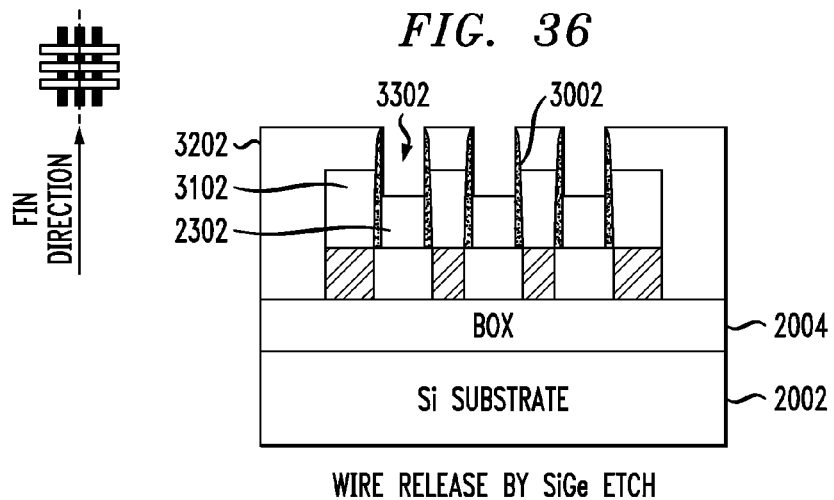
FIG. 36 — WIRE RELEASE BY SiGe ETCH

GATE STACK + PLANARIZATION

GATE STACK + PLANARIZATION

GATE STACK + PLANARIZATION

FIG. 40
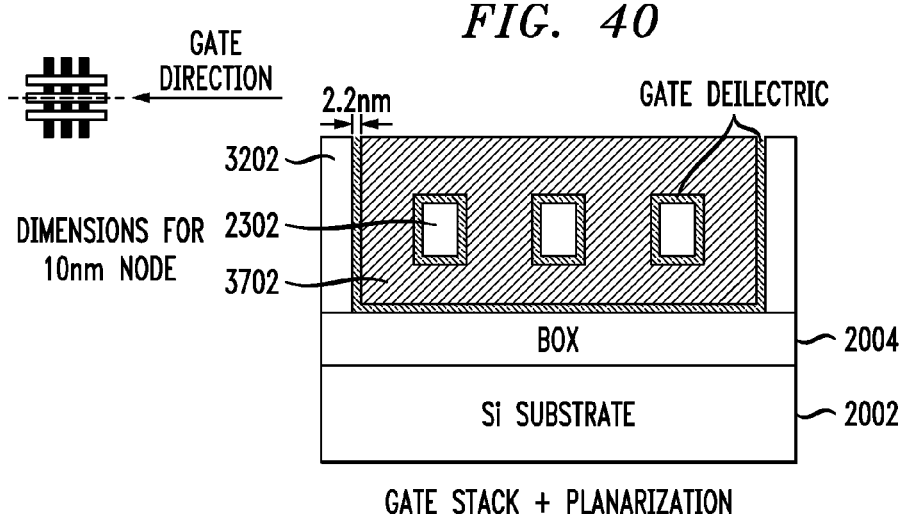
GATE STACK + PLANARIZATION
SIMULATED REGION (REFLECTING BOUNDARY CONDITIONS)
FIG. 41
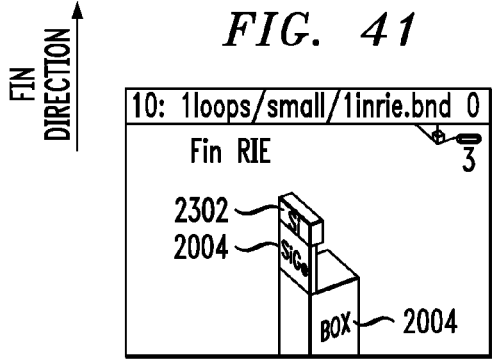
FIG. 42
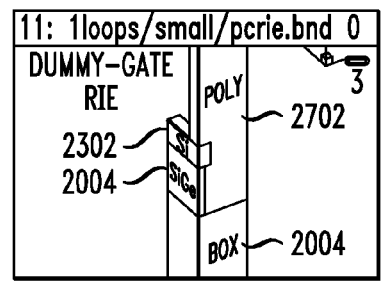
FIG. 43
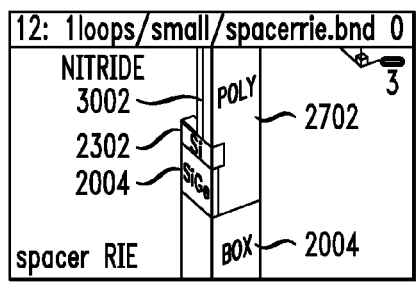
FIG. 44
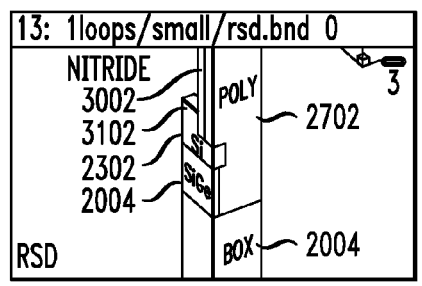
40nm GATE PITCH, 40nm WIRE PITCH

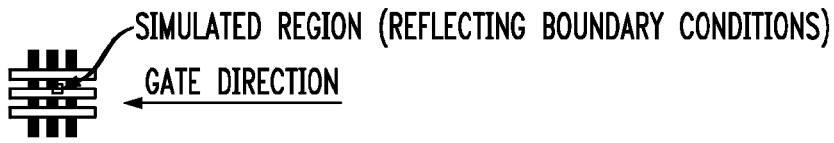
*FIG. 45*          *FIG. 46*
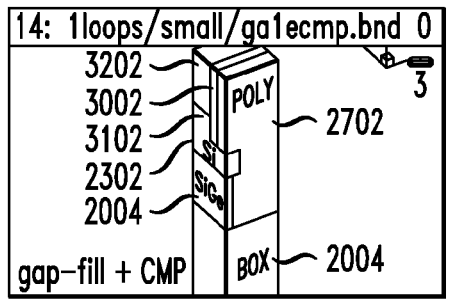 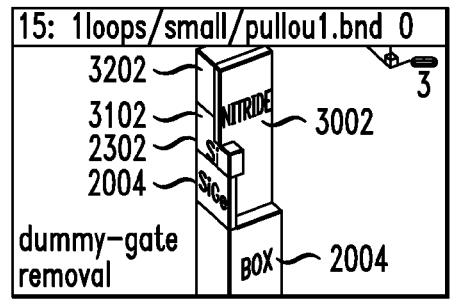
*FIG. 47*          *FIG. 48*
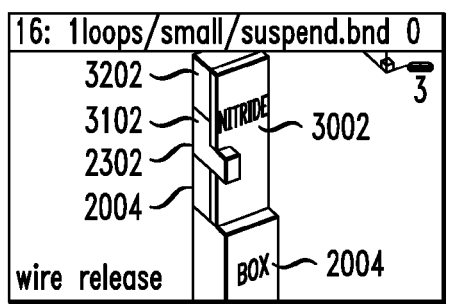 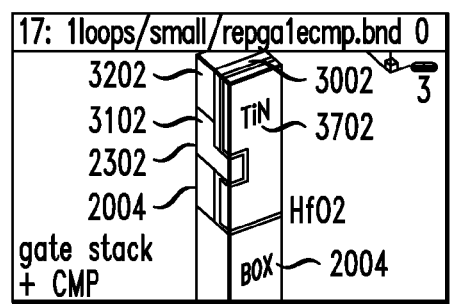
*FIG. 49*          *FIG. 50*
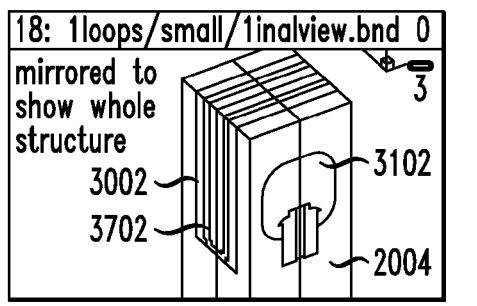 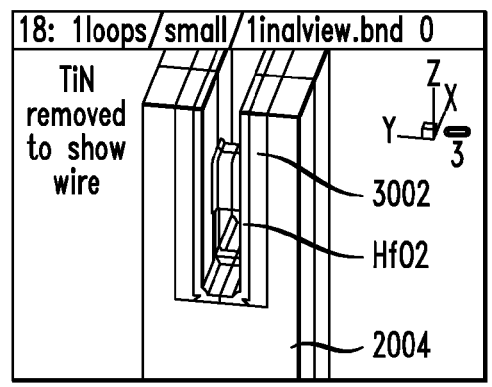

US 8,809,131 B2

REPLACEMENT GATE FIN FIRST WIRE LAST GATE ALL AROUND DEVICES

FIELD OF THE INVENTION

The present invention relates to nanowire field effect transistor (FET) devices and more particularly, to techniques for fabricating a nanowire FET device using a replacement gate fin first, wire last process in order to form gate all around devices.

BACKGROUND OF THE INVENTION

In its basic form, a field-effect transistor (FET) includes a source region, a drain region and a channel between the source and drain regions. A gate regulates electron flow through the channel between the source and drain regions.

Due to their superior electrostatics gate all around nanowire channel field effect transistors (e.g., nanowire FETs) are expected to enable density scaling beyond current planar CMOS technology. There are however notable challenges related to fabricating gate all around nanowire FETs, especially at scaled dimensions. For instance, to increase layout density, the nanowires are placed close together and/or are stacked. Forming a gate surrounding the nanowires in this case is challenging.

Thus, improved techniques for fabricating gate all around nanowire FETs would be desirable.

SUMMARY OF THE INVENTION

The present invention provides techniques for fabricating a nanowire field effect transistor (FET) device using a replacement gate fin first, wire last process in order to form gate all around devices. In one aspect of the invention, a method of fabricating a nanowire FET device is provided. The method includes the following steps. A wafer is provided. At least one sacrificial layer and at least one silicon layer are formed on the wafer in a stack. A plurality of fins is patterned in the stack. A plurality of dummy gates is formed over one or more first portions of the fins which will serve as channel regions of the FET device, and wherein one or more second portions of the fins which remain exposed after the step of forming the dummy gates has been performed will serve as source and drain regions of the FET device. A gap filler material is deposited surrounding the dummy gates. The gap filler material is planarized. The dummy gates are removed selective to the gap filler material so as to form trenches in the gap filler material. Portions of the silicon layer are released from the fins within the trenches by removing portions of the sacrificial layer from beneath the fins within the trenches, wherein the portions of the silicon layer released within the trenches will serve as nanowire channels of the FET device. A plurality of replacement gates is formed within the trenches that surround the nanowire channels of the FET device in a gate all around configuration.

In another aspect of the invention, a FET device is provided. The FET device includes a plurality of fins formed on a wafer, wherein each of the fins comprises at least one sacrificial layer and at least one silicon layer in a stack which serve as source and drain regions of the FET device, and wherein portions of the silicon layer released from the fins form nanowire channels of the FET device; a gap filler material surrounding the fins; and a plurality of gates, formed within trenches in the gap filler material, that surround the nanowire channels of the FET device in a gate all around configuration.

A more complete understanding of the present invention, as well as further features and advantages of the present invention, will be obtained by reference to the following detailed description and drawings.

BRIEF DESCRIPTION OF THE DRAWINGS

FIG. 4 is a cross-sectional diagram illustrating fin stacks having been etched into the bulk Si wafer, Si and sacrificial layers according to an embodiment of the present invention;

FIG. 5 is a cross-sectional diagram illustrating the etched fin stacks from another perspective, i.e., as a cross-sectional cut through the gate direction of the device, according to an embodiment of the present invention;

FIG. 6 is a cross-sectional diagram illustrating a recessed STI oxide having been formed around the base of each of the fins according to an embodiment of the present invention;

FIG. 13 is a cross-sectional diagram illustrating a gap filler material having been deposited onto the wafer, filling the spaces between the fins and between the dummy gates according to an embodiment of the present invention;

FIG. 14 is a cross-sectional diagram illustrating the dummy gates having been removed selective to the gap filler material according to an embodiment of the present invention;

FIG. 15 is a cross-sectional diagram illustrating removal of the dummy gates from another perspective, i.e., as a cross-sectional cut through the fin direction of the device through one of the fins, according to an embodiment of the present invention;

FIG. 16 is a cross-sectional diagram illustrating the nanowires having been released from the fin stack by removing the sacrificial layer from the fin stack according to an embodiment of the present invention;

FIG. 17 is a cross-sectional diagram illustrating release of the nanowire channels from the fin stacks from another perspective, i.e., as a cross-sectional cut through the fin direction of the device through one of the trenches formed by removal of the dummy gates according to an embodiment of the present invention;

FIG. 18 is a cross-sectional diagram illustrating replacement gates having been formed in the trenches formed by removal of the dummy gates according to an embodiment of the present invention;

FIG. 25 is a cross-sectional diagram illustrating the etched fin stacks from another perspective, i.e., as a cross-sectional cut through the gate direction of the device, according to an embodiment of the present invention;

FIG. 26 is a cross-sectional diagram illustrating a dummy gate material having been deposited surrounding the fins and a gate hardmask having been formed on top of the dummy gate material according to an embodiment of the present invention;

FIG. 27 is a cross-sectional diagram illustrating the gate hardmasks having been used to pattern the dummy gate material into a plurality of individual dummy gates according to an embodiment of the present invention;

FIG. 34 is a cross-sectional diagram illustrating removal of the dummy gates from another perspective, i.e., as a cross-sectional cut through the fin direction of the device through one of the fins, according to an embodiment of the present invention;

FIG. 35 is a cross-sectional diagram illustrating the nanowires having been released from the fin stack by removing the sacrificial layer from the fin stack according to an embodiment of the present invention;

FIG. 36 is a cross-sectional diagram illustrating release of the nanowire channels from the fin stacks from another perspective, i.e., as a cross-sectional cut through the fin direction of the device through one of the fins according to an embodiment of the present invention;

FIG. 40 is a cross-sectional diagram illustrating formation of the replacement gates from another perspective, i.e., as a cross-sectional cut through the gate direction of the device through one of the gates according to an embodiment of the present invention;

FIG. 41 is a three-dimensional diagram illustrating the fin etch in the SiGe SOI exemplary process flow according to an embodiment of the present invention;

FIG. 42 is a three-dimensional diagram illustrating the dummy gate formation in the SiGe SOI exemplary process flow according to an embodiment of the present invention;

FIG. 43 is a three-dimensional diagram illustrating spacer formation in the SiGe SOI exemplary process flow according to an embodiment of the present invention;

FIG. 44 is a three-dimensional diagram illustrating raised source and drain (RSD) formation in the SiGe SOI exemplary process flow according to an embodiment of the present invention;

FIG. 45 is a three-dimensional diagram illustrating deposition of the gap filler material according to an embodiment of the present invention;

FIG. 46 is a three-dimensional diagram illustrating the dummy gate removal according to an embodiment of the present invention;

FIG. 47 is a three-dimensional diagram illustrating release of the nanowire channel according to an embodiment of the present invention;

FIG. 48 is a three-dimensional diagram illustrating formation of the replacement gate according to an embodiment of the present invention;

FIG. 49 is a three-dimensional diagram illustrating the completed device structure according to an embodiment of the present invention; and FIG. 50 is a three-dimensional diagram illustrating the completed device structure with the replacement gate removed to illustrate the gate all around (GAA) configuration according to an embodiment of the present invention.

DETAILED DESCRIPTION OF PREFERRED EMBODIMENTS

Provided herein are techniques for fabricating gate all around nanowire field effect transistors (FETs) using a replacement gate process flow. In one first exemplary embodiment, the process is illustrated starting with a bulk silicon (Si) wafer by way of reference to FIGS. 1-19. In a second exemplary embodiment, the process is illustrated starting with a silicon-on-insulator wafer by way of reference to FIGS. 20-40. As will be described in detail below, the present techniques make use of a damascene gate process to construct source/drain regions that are self-aligned with the gate.

Figure 1:
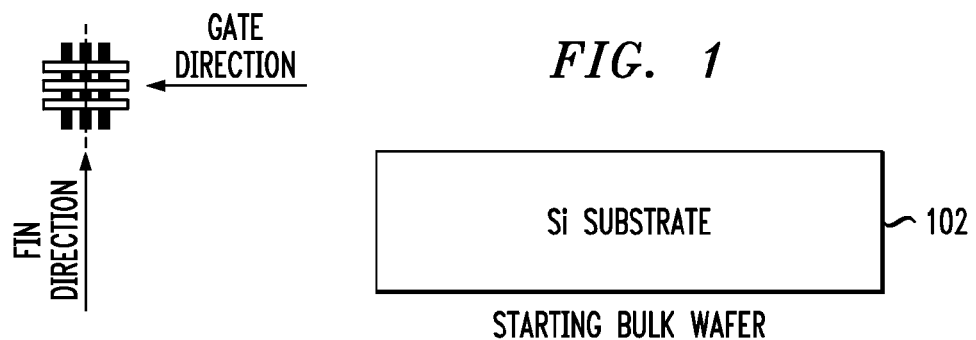
FIG. 1 is a cross-sectional diagram illustrating a starting platform for a nanowire field effect transistor fabrication process flow, i.e., a bulk silicon (Si) wafer according to an embodiment of the present invention.

Description of the first exemplary nanowire FET fabrication process flow is now presented by way of reference to FIGS. 1-19. As shown in FIG. 1 the starting platform in this example is a bulk Si wafer 102.

Each of the figures illustrating the fabrication process will show a cross-sectional cut through a portion of the device structure. Thus a legend is provided at the top left corner of each figure illustrating the various orientations of the cuts shown. Specifically, by way of reference to the legend in FIG. 1, there are two orientations of cuts that will be illustrated throughout the figures. One is a cut along the fin direction. As will be described in detail below fins will be formed which will serve as the channel, source and drain regions of the device. The other is a cut along the gate direction. As will be described in detail below gate stacks will be formed surrounding nanowire channels of the device (gate all around configuration). Since FIG. 1 is showing the starting wafer (or substrate), the cross-sectional cut depicted is the same in either the fin direction or the gate direction.

Figure 2:
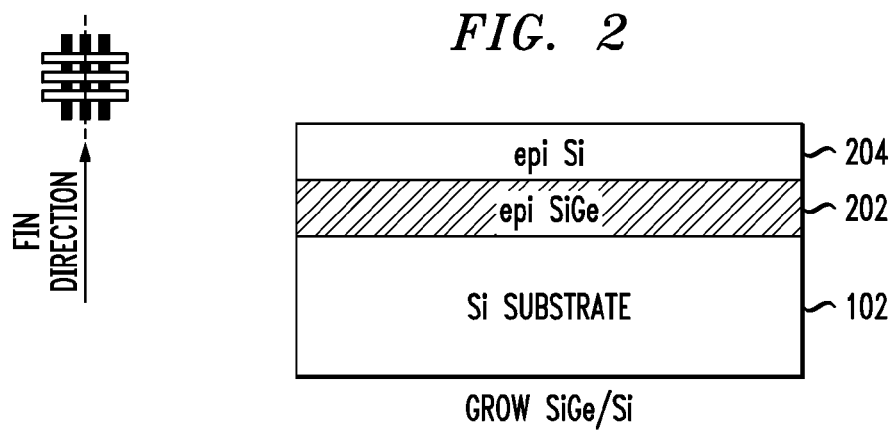
FIG. 2 is a cross-sectional diagram illustrating an alternating series of Si and sacrificial layers having been formed on the bulk Si wafer in a stack according to an embodiment of the present invention.

As shown in FIG. 2, an alternating series of Si and sacrificial layers are then formed on the bulk Si wafer 102 in a stack. Specifically, a sacrificial layer 202 is epitaxially grown on the bulk Si wafer 102. Sacrificial layer 202 is formed from a crystalline material which can be etched selectively to Si, such as silicon germanium (SiGe).

A Si layer 204 is then epitaxially grown over sacrificial layer 202. Further, one or more additional sacrificial layers and/or crystalline Si layers may optionally be epitaxially grown in an alternating fashion on top of bulk Si wafer 102, in which the properties of the additional sacrificial layer(s) are the same as sacrificial layer 202, and the properties of the additional crystalline Si layer(s) are the same as Si layer 204.

Reference to the legend at the top left corner of FIG. 2 shows the orientation of the cross-sectional cut depicted in FIG. 2. Specifically, the orientation of the cross-sectional cut shown in FIG. 2 is along the fin direction.

Fin hardmasks 302 are then formed on the Si layer 204 (or if additional sacrificial layers and/or crystalline Si layers are formed, then the fin hardmasks 302 are formed on the topmost Si layer in the stack). According to the exemplary embodiment shown illustrated in FIG. 3, the fin hardmasks are formed from a nitride material.

The fin hardmasks may be formed by first depositing the hardmask material (for example silicon nitride) onto the Si layer 204 using, for example, chemical vapor deposition (CVD), plasma enhanced CVD (PECVD) or any suitable technique for dielectric deposition that does not induce a physical or chemical change to Si layer 204. According to an exemplary embodiment, the hardmask material is deposited onto Si layer 204 to a thickness of from about 15 nanometers (nm) to about 20 nm, e.g., about 20 nm. The deposited hardmask material is then patterned into a plurality of the individual fin hardmasks 302. The patterning of the hardmasks is commensurate with a desired footprint and location of the fins which will be used to form the source, drain and channel regions of the device. According to an exemplary embodiment, a resist film (not shown) is deposited on the hardmask material and patterned with the footprint and location of each of the fin hardmasks 302. In one example, reactive ion etching (RIE) is used to form the fin hardmasks, and therefore the resist film comprises a resist material such as hydrogen silsesquioxane (HSQ) patterned using electron beam (e-beam) lithography and transferred to a carbon-based resist.

Figure 3:
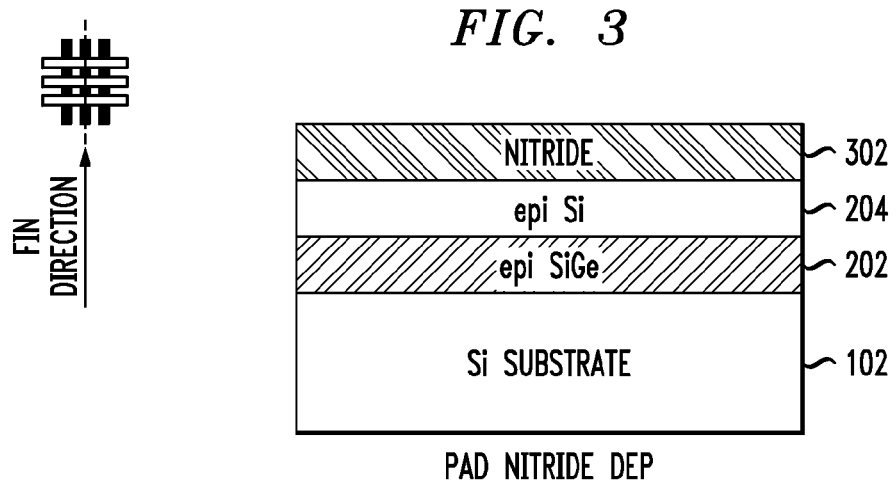
FIG. 3 is a cross-sectional diagram illustrating nanowire hardmasks having been formed on the top-most Si layer in the stack according to an embodiment of the present invention.

Reference to the legend at the top left corner of FIG. 3 shows the orientation of the cross-sectional cut depicted in FIG. 3. Specifically, the orientation of the cross-sectional cut shown in FIG. 3 is along the fin direction.

Fins are then etched into the bulk Si wafer, Si and sacrificial layers. See FIG. 4. Portions of the Si layer, once released from the sacrificial layer, will form nanowire channels of the device. According to an exemplary embodiment, a Si-selective RIE is used to remove portions of the bulk Si wafer/Si/sacrificial layers not masked by the fin hardmasks 302. As shown in FIG. 4, the etch can be endpointed when the etch proceeds through a portion of the bulk Si wafer 102, thus forming the fins into a portion 102a of the bulk Si wafer. One of ordinary skill in the art would know how, based on the present teachings to endpoint the etch so as to etch only part way through the bulk Si wafer.

Since the fin etch is being performed at this point in the process, i.e., before the dummy gate/replacement gate steps, this process is also referred to herein as a fin first process. Further, since the nanowire channels formed in the fins will be released from the sacrificial layer after the dummy gate steps, this process is also referred to herein as a wire last process.

Reference to the legend at the top left corner of FIG. 4 shows the orientation of the cross-sectional cut depicted in FIG. 4. Specifically, the orientation of the cross-sectional cut shown in FIG. 4 is along the fin direction.

FIG. 5 depicts the etched fin stacks from another perspective, i.e., as a cross-sectional cut through the gate direction of the device (see the legend at the top left corner of FIG. 5 which shows that the orientation of the cross-sectional cut depicted in FIG. 5 is along the gate direction). In this example, the fin hardmasks 302 are configured to have a pitch, i.e., a spatial frequency, of less than about 200 nm, for example, from about 10 nm to about 200 nm, e.g., from about 40 nm to about 50 nm. To maximize layout density and minimize parasitic capacitance, the pitch should be as small as possible within patterning and processing limits. To achieve pitches smaller than what can be defined by direct lithography, a pitch doubling technique such as sidewall image transfer or double patterning/double etching can be used. A width 502 of each fin hardmask 302 is less than about 40 nm, for example, from about five nm to about 40 nm, e.g., from about five nm to about 10 nm. The pitch/width of each fin hardmask 302 will determine a pitch/width of each nanowire.

Thus, based on the pitch and width of the fin hardmasks 302, the fins formed have a pitch, i.e., a spatial frequency, of less than about 200 nm, for example, from about 10 nm to about 200 nm, e.g., from about 40 nm to about 50 nm, and a width of less than about 40 nm, for example, from about five nm to about 40 nm, e.g., from about five nm to about 10 nm.

Further, as shown in FIG. 5, the sacrificial layer 202, following the fin etch, is thinner than the Si layer 204. This is the result of the SiGe being etched laterally during the fin etch. Also, during the oxidation performed before the dummy gate deposition (see below), the SiGe may be consumed slightly more than the Si layer.

Next, a shallow trench isolation (STI) oxide is blanket deposited onto the wafer covering the fins. See FIG. 6. According to an exemplary embodiment, the STI oxide is deposited using a high-density plasma (HDP). Chemical mechanical polishing is then used to planarize the STI oxide using the nanowire hardmasks 302 as an etch stop. A second etch step is then used to recess the STI oxide and expose a portion of each of the fins. The result is recessed oxide 602 surrounding a base of each of the fins. According to an exemplary embodiment, the STI oxide is recessed using a selective RIE. The fin hardmasks 302 may also be removed at this step, for example using a nitride-selective etch.

Reference to the legend at the top left corner of FIG. 6 shows the orientation of the cross-sectional cut depicted in FIG. 6. Specifically, the orientation of the cross-sectional cut shown in FIG. 6 is along the gate direction.

A dummy gate is then formed surrounding the exposed portions of the fins (portions of the fins exposed after recess of the STI oxide is performed, see description of FIG. 6, above). To form the dummy gate, a dummy gate material 702 is first blanket deposited onto the wafer covering the fins. See FIG. 7. According to an exemplary embodiment, the dummy gate material 702 is poly-silicon that is deposited onto the wafer using low pressure chemical vapor deposition (LPCVD).

Figure 7:
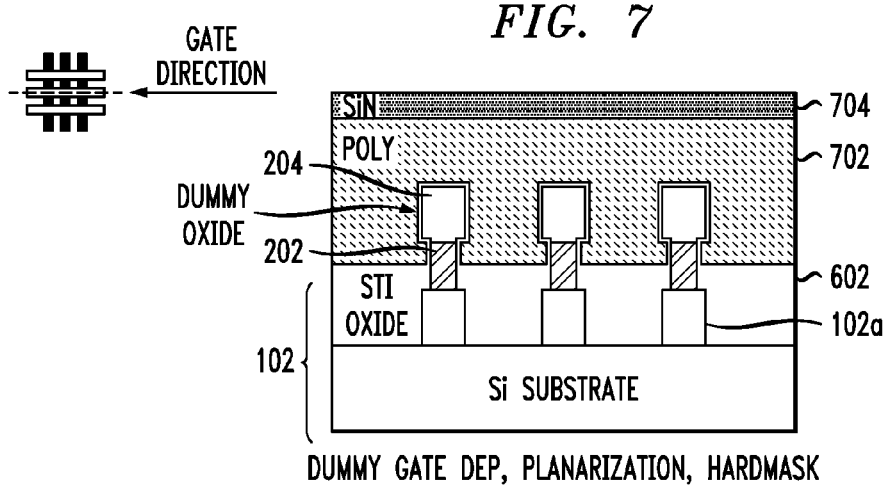
FIG. 7 is a cross-sectional diagram illustrating a dummy gate material having been deposited surrounding the fins and a gate hardmask having been formed on top of the dummy gate material according to an embodiment of the present invention.

Prior to depositing the dummy gate material 702, an oxide layer may be formed on the exposed surfaces of the fins (labeled "dummy oxide" in FIG. 7). This oxide layer may be formed on the fins using thermal oxidation and may have a thickness of from 2 nm to about 4 nm.

As provided above, during this oxidation step, a bit more of the SiGe may be consumed than the Si layer, thus resulting in a laterally thinner SiGe layer than Si layer, see for example, FIG. 5 above.

The oxide layer is formed to provide an etch stop layer for the dummy gate removal process. For instance, when poly-silicon is used as the dummy gate material, a layer is needed to protect the Si channel during the poly-silicon removal step since there is essentially no etch contrast between poly-silicon and single crystal Si.

Following deposition of the dummy gate material 702, the dummy gate material 702 can be planarized using, e.g., CMP. Gate hardmasks 704 are then formed on the dummy gate material 702. See FIG. 7. According to the exemplary embodiment shown illustrated in FIG. 3, the gate hardmasks are formed from a nitride material, such as silicon nitride (SiN).

The gate hardmasks may be formed by first depositing the hardmask material (for example SiN) onto the dummy gate material 702 using, for example, CVD or PECVD. According to an exemplary embodiment, the hardmask material is deposited onto the dummy gate material 702 to a thickness of from about 15 nm to about 20 nm, e.g., about 20 nm. The deposited hardmask material is then patterned into a plurality of the individual gate hardmasks 704. The patterning of the hardmasks is commensurate with a desired location of the gates of the device. According to an exemplary embodiment, a resist film (not shown) is deposited on the hardmask material and patterned with the footprint and location of each of the gate hardmasks 704. In one example, RIE is used to form the gate hardmasks, and therefore the resist film comprises a resist material such as HSQ patterned using e-beam lithography and transferred to a carbon-based resist. Gate hardmasks mask the footprint and location of the dummy gate (over what are to be the channel regions of the device).

Reference to the legend at the top left corner of FIG. 7 shows the orientation of the cross-sectional cut depicted in FIG. 7. Specifically, the orientation of the cross-sectional cut shown in FIG. 7 is along the gate direction.

Next, the gate hardmasks 704 are used to pattern the dummy gate material 702 into a plurality of individual dummy gates 802. See FIG. 8. Dummy gates 802 can be patterned using a poly-silicon selective RIE around the gate hardmasks 704.

Figure 8:
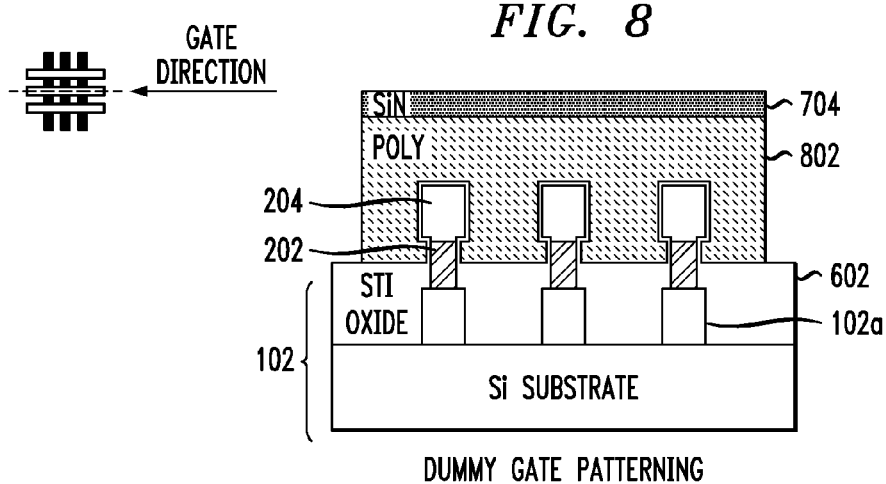
FIG. 8 is a cross-sectional diagram illustrating the gate hardmasks having been used to pattern the dummy gate material into a plurality of individual dummy gates according to an embodiment of the present invention.

Reference to the legend at the top left corner of FIG. 8 shows the orientation of the cross-sectional cut depicted in FIG. 8. Specifically, the orientation of the cross-sectional cut shown in FIG. 8 is along the gate direction.

Figure 9:
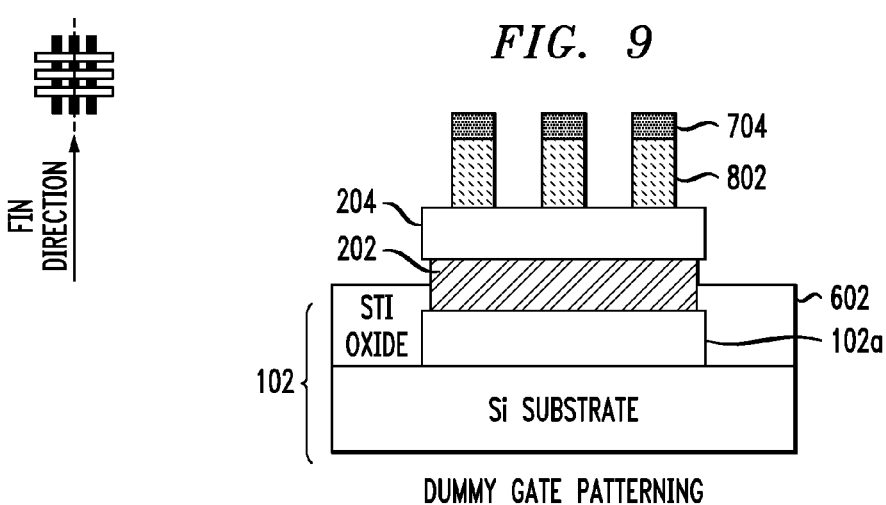
FIG. 9 is a cross-sectional diagram illustrating the patterning of the dummy gates from another perspective, i.e., as a cross-sectional cut through the fin direction of the device through one of the fins, according to an embodiment of the present invention.

FIG. 9 depicts the patterning of dummy gates 802 from another perspective, i.e., as a cross-sectional cut through the fin direction of the device (see the legend at the top left corner of FIG. 9 which shows that the orientation of the cross-sectional cut depicted in FIG. 9 is along the fin direction). In this depiction, the cross-sectional cut along the fin direction is through one of the fins.

Figure 10:
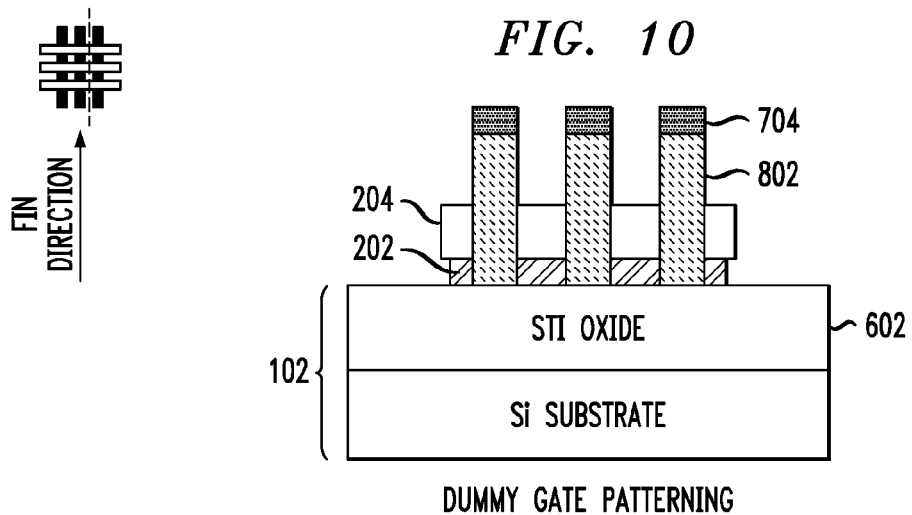
FIG. 10 is a cross-sectional diagram illustrating the patterning of the dummy gates from yet another perspective, i.e., as a cross-sectional cut through the fin direction of the device between two of the fins, according to an embodiment of the present invention.

FIG. 10 depicts the patterning of dummy gates 802 from yet another perspective, i.e., as a cross-sectional cut through the fin direction of the device (see the legend at the top left corner of FIG. 10 which shows that the orientation of the cross-sectional cut depicted in FIG. 10 is along the fin direction). In this depiction, the cross-sectional cut along the fin direction is between two of the fins.

Spacers 1102 are then formed on opposite sides of the dummy gates 802. See FIG. 11. Spacers 1102 serve to offset the gate a certain distance from the source/drain regions. According to an exemplary embodiment, spacers 1102 are formed by first depositing a nitride layer onto the wafer, covering the fins. A resist film (not shown) is then deposited on the nitride layer, masked and patterned with a location and footprint of the spacers. A nitride-selective RIE is then used to define spacers 1102 in the nitride layer.

Figure 11:
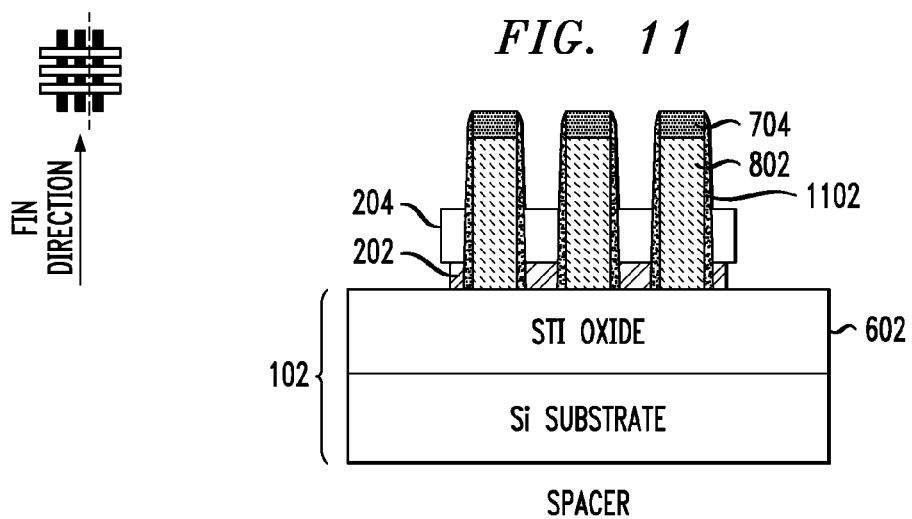
FIG. 11 is a cross-sectional diagram illustrating spacers having been formed on opposite sides of the dummy gates according to an embodiment of the present invention.

Reference to the legend at the top left corner of FIG. 11 shows the orientation of the cross-sectional cut depicted in FIG. 11. Specifically, the orientation of the cross-sectional cut shown in FIG. 11 is along the fin direction. It is notable that in the depiction in FIG. 11, the cross-sectional cut along the fin direction is between two of the fins.

Optionally, next an epitaxy step may be used to form raised source and drain regions (RSD) 1202 on the exposed portions of the fins which will serve as source and drain regions of the device (i.e., the channel regions of the fins are already covered by the dummy gates 802. See FIG. 12. Epitaxy to form the raised source and drain regions 1202 may be carried out using vapor-phase epitaxy (VPE), molecular beam epitaxy (MBE) or liquid phase epitaxy (LPE) with a gaseous or liquid precursor, such as silicon tetrachloride. The parameters and process for epitaxy to form raised source and drain regions are known to those of skill in the art and thus are not described further herein.

Prior to forming the raised source and drain regions 1202, the source and drain regions of the fins may optionally be doped using, for example, in-situ doping with a suitable source and drain dopant. Suitable source and drain dopants include, but are not limited to, boron and phosphorus.

Figure 12:
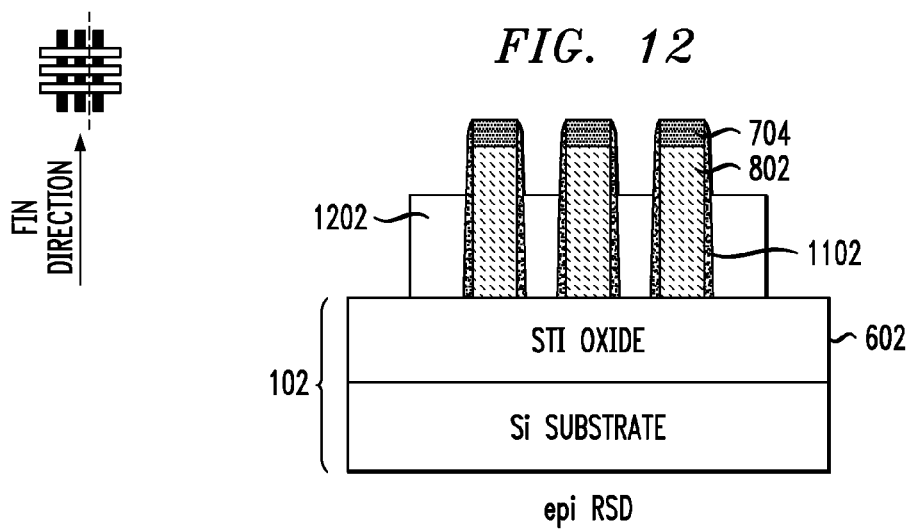
FIG. 12 is a cross-sectional diagram illustrating optional raised source and drain (RSD) regions having been formed on the exposed (source and drain) regions of the fins according to an embodiment of the present invention.

Reference to the legend at the top left corner of FIG. 12 shows the orientation of the cross-sectional cut depicted in FIG. 12. Specifically, the orientation of the cross-sectional cut shown in FIG. 12 is along the fin direction. It is notable that in the depiction in FIG. 12, the cross-sectional cut along the fin direction is between two of the fins.

A gap filler material 1302 is then deposited onto the wafer, filling the spaces between the fins and between the dummy gates 802. See FIG. 13. Gap filler material 1302 can include any suitable filler material, including a dielectric material, such as silicon dioxide ($SiO_2$). According to an exemplary embodiment, gap filler material 1302 is deposited using a high-density plasma (HDP). CMP is then used to planarize the filler material, using the dummy gates 802 as an etch stop. During this CMP step, any remaining gate hardmasks 704 are also removed.

Reference to the legend at the top left corner of FIG. 13 shows the orientation of the cross-sectional cut depicted in FIG. 13. Specifically, the orientation of the cross-sectional cut shown in FIG. 13 is along the fin direction. It is notable that in the depiction in FIG. 13, the cross-sectional cut along the fin direction is between two of the fins.

The dummy gates 802 are then removed selective to the gap filler material 1302. See FIG. 14. Dummy gates 802 can be removed using a chemical etching process, such as chemical down stream or potassium hydroxide (KOH) etching, or RIE. As shown in FIG. 14, removal of dummy gates 802 results in a trench 1402 being formed in gap filler material 1302. According to an exemplary embodiment, trench 1402 distinguishes a (nanowire) channel region of the device from source and drain regions of the device.

Reference to the legend at the top left corner of FIG. 14 shows the orientation of the cross-sectional cut depicted in FIG. 14. Specifically, the orientation of the cross-sectional cut shown in FIG. 14 is along the fin direction. It is notable that in the depiction in FIG. 14, the cross-sectional cut along the fin direction is between two of the fins.

FIG. 15 depicts the removal of the dummy gates 802 from another perspective, i.e., as a cross-sectional cut through the fin direction of the device (see the legend at the top left corner of FIG. 15 which shows that the orientation of the cross-sectional cut depicted in FIG. 15 is along the fin direction). It is notable that in the depiction in FIG. 15, the cross-sectional cut along the fin direction is through one of the fins.

As provided above, the Si layer 204 will be used to form nanowire channels of the device. In order to be able to form a gate (a replacement gate, see below) that surrounds the nanowire channels, the nanowire channels have to be released from the fin. Namely, the sacrificial layer 202 is removed from the fin, resulting in a suspended nanowire formed from Si layer 204. See FIG. 16. Further, as provided above, more Si and sacrificial layers than what are shown in the figures may be implemented in the same manner as described above, except that in the initial stages of the process, additional Si and sacrificial layers would be formed in the stack (see above). In that case, multiple layers of suspended nanowire channels would be formed in this step. These multiple layers of nanowire channels are commonly referred to as a nanowire "mesh."

The sacrificial layers may be removed from the fin stack as follows. A chemical etchant can be employed that exploits the lower oxidation potential of the sacrificial layers as compared to the Si layers. Examples of such etchants include, but are not limited to a 1:2:3 mixture of HF:hydrogen peroxide ($H_2O_2$):acetic acid ($CH_3COOH$), or a mixture of sulfuric acid ($H_2SO_4$) and $H_2O_2$. Alternatively, the sacrificial layers can be selectively removed using a dry etching process such as oxygen ($O_2$) plasma etching or plasma chemistries typically used for etching.

Reference to the legend at the top left corner of FIG. 16 shows the orientation of the cross-sectional cut depicted in FIG. 16. Specifically, the orientation of the cross-sectional cut shown in FIG. 16 is along the fin direction. It is notable that in the depiction in FIG. 16, the cross-sectional cut along the fin direction is between two of the fins.

FIG. 17 depicts the release of the nanowire channels from the fin stacks from another perspective, i.e., as a cross-sectional cut through the fin direction of the device (see the legend at the top left corner of FIG. 17 which shows that the orientation of the cross-sectional cut depicted in FIG. 17 is along the fin direction). It is notable that in the depiction in FIG. 17, the cross-sectional cut along the fin direction is through one of the fins.

Replacement gates 1802 are then formed in the trenches 1402 surrounding the nanowire channels. See FIG. 18. The replacement gates 1802 are formed by first filling the trenches 1402 with a gate material. Once the gate material is filled into trenches 1402, CMP is used to planarize the gate material. Suitable gate materials include, but are not limited to, one or more of polysilicon, a deposited metal(s) and a hybrid stack of multiple materials such as metal polysilicon.

Prior to the formation of the replacements gates 1802, a gate dielectric material is preferably first deposited surrounding the nanowire channels. According to an exemplary embodiment, the gate dielectric material employed is a high-k material, such as hafnium oxide, that is deposited using a conformal deposition process such as atomic layer deposition (ALD). High-k dielectrics are particularly well suited for this gate all around process flow due to the need for a small equivalent oxide thickness for performance and electrostatic control reasons and also the need for a relatively large physical thickness to fill gaps underneath the spacers. See below.

Reference to the legend at the top left corner of FIG. 18 shows the orientation of the cross-sectional cut depicted in FIG. 18. Specifically, the orientation of the cross-sectional cut shown in FIG. 18 is along the fin direction. It is notable that in the depiction in FIG. 18, the cross-sectional cut along the fin direction is between two of the fins.

Figure 19:
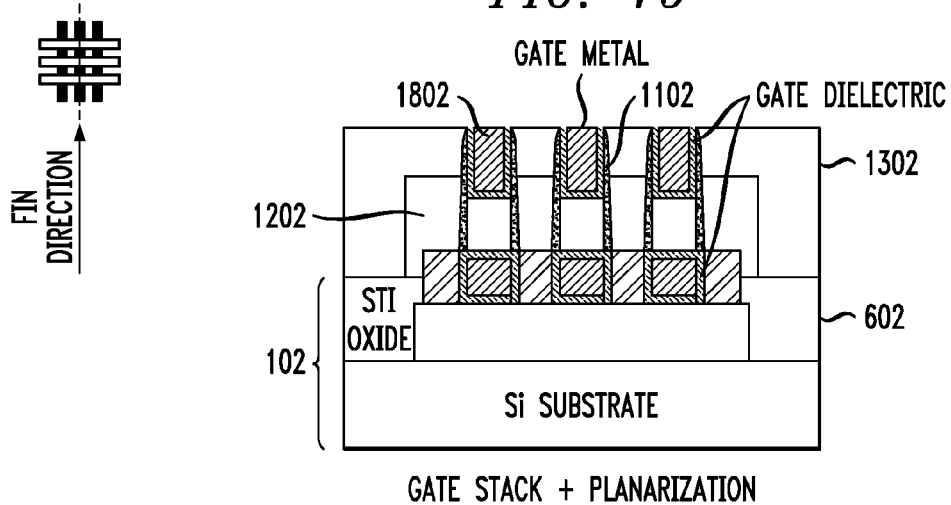
FIG. 19 is a cross-sectional diagram illustrating formation of the replacement gates from another perspective, i.e., as a cross-sectional cut through the fin direction of the device through one of the fins according to an embodiment of the present invention.

FIG. 19 depicts the formation of the replacement gates 1802 from another perspective, i.e., as a cross-sectional cut through the fin direction of the device (see the legend at the top left corner of FIG. 19 which shows that the orientation of the cross-sectional cut depicted in FIG. 19 is along the fin direction). It is notable that in the depiction in FIG. 19, the cross-sectional cut along the fin direction is through one of the fins.

Since the spacers are formed prior to the nanowire channel release from the fins (see above), once the sacrificial material is removed from the fins, a gap is left in the spacers under the nanowire channel. If that gap were to be left open (i.e., not filled with dielectric), then the replacement gate material would fill the gap. This extra bit of gate material will increase the harmful parasitic capacitance of the gate to the source and drain regions.

Thus, as shown in FIG. 19, the gate dielectric is used to fill that gap. As provided above, the gate dielectric employed is preferably a high-k dielectric deposited using a conformal process, such as ALD. Thus, in order to "pinch-off" the gap, the thickness of the (high-k) gate dielectric as deposited needs to be greater than half of the width of the gap (alternatively stated, the gap width needs to be less than 2 times the dielectric thickness). That way the gap will be completely filled by the dielectric and the gate metal will not get into the gap. At practical dimensions this is only achievable with high-k dielectric because we require a small equivalent oxide thickness (EOT) for performance and electrostatic control reasons, but we require a relatively large physical thickness to fill the gap. This concept of pinching-off the gap in the spacers under the nanowire channel is further illustrated in FIG. 39, described below.

Figure 20:
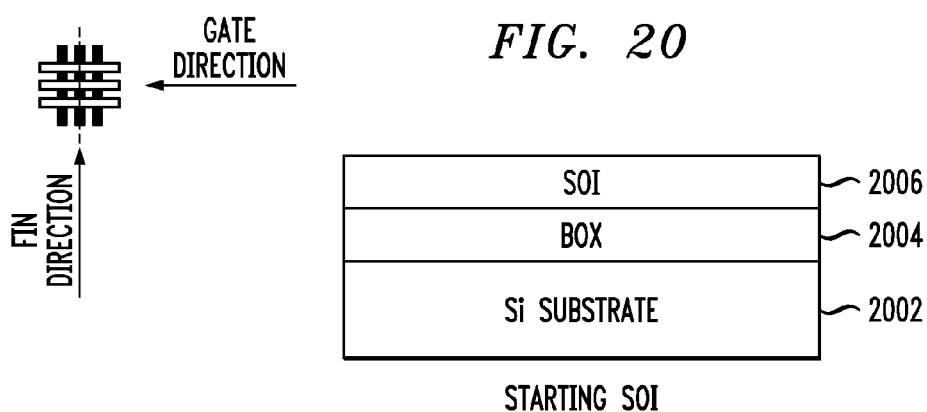
FIG. 20 is a cross-sectional diagram illustrating a starting platform for a nanowire field effect transistor fabrication process flow, i.e., a silicon-on-insulator (SOI) wafer having a SOI layer separated from a substrate by a buried oxide (BOX), according to an embodiment of the present invention.

Description of a second exemplary nanowire FET fabrication process flow is now presented by way of reference to FIGS. 20-40. As shown in FIG. 1 the starting platform in this example is a semiconductor-on-insulator (SOI) wafer. As shown in FIG. 20, the SOI wafer includes a Si substrate 2002 and a Si-containing SOI layer 2006 separated from the Si substrate 2002 by a buried oxide or BOX 2004.

As with the first exemplary process flow provided above, each of the figures illustrating the fabrication process will show a cross-sectional cut through a portion of the device structure. Thus a legend is provided at the top left corner of each figure illustrating the various orientations of the cuts shown. Specifically, by way of reference to the legend in FIG. 20, there are two orientations of cuts that will be illustrated throughout the figures. One is a cut along the fin direction. As will be described in detail below fins will be formed which will serve as the channel, source and drain regions of the device. The other is a cut along the gate direction. As will be described in detail below gate stacks will be formed surrounding nanowire channels of the device (gate all around configuration). Since FIG. 20 is showing the stating wafer (or substrate), the cross-sectional cut depicted is the same in either the fin direction or the gate direction.

In this exemplary embodiment, it is desirable to have the SOI layer 2006 contain SiGe. However, SiGe SOI wafers are generally not commercially available. Thus, in order to produce a SiGe SOI wafer, as shown in FIG. 21, a SiGe layer 2102 is first epitaxially grown on the SOI layer 2006.

Figure 21:
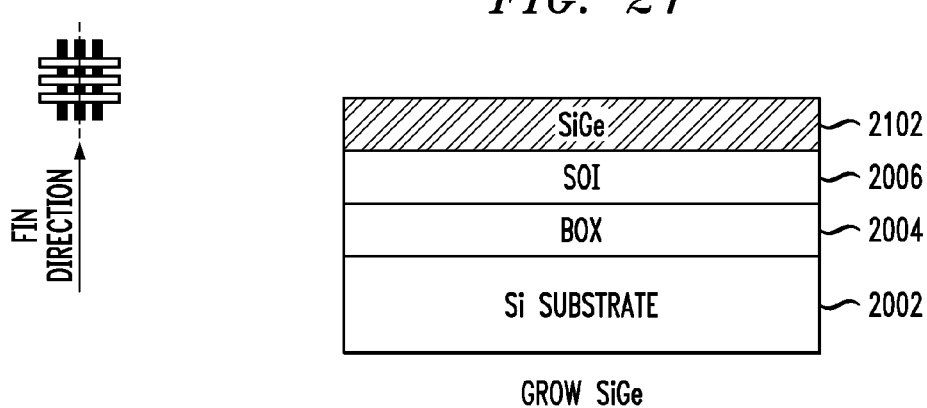
FIG. 21 is a cross-sectional diagram illustrating a SiGe layer having been epitaxially grown on the SOI layer according to an embodiment of the present invention.

Reference to the legend at the top left corner of FIG. 21 shows the orientation of the cross-sectional cut depicted in FIG. 21. Specifically, the orientation of the cross-sectional cut shown in FIG. 21 is along the fin direction.

Next, the SiGe layer 2102 is condensed, forming a single SiGe SOI layer 2202 from the SOI layer 2006 and the SiGe layer 2102. See FIG. 22. Specifically, thermal oxidation (e.g., at a temperature of from about 900° C. to about 1,200° C., e.g., about 1,100° C. for a duration of from about 5 minutes to about 15 minutes, e.g., about 10 minutes, in $O_2$) of the SiGe layer 2102 will result in the Si in the SiGe layer 2102 being consumed (by the oxidation process) while the Ge gets driven down into the SOI layer 2006. The result is a SiGe SOI layer 2202. The SiGe SOI layer 2202, which is a sacrificial layer, will serve the same function as the sacrificial layer 202 in the first exemplary process flow (see, for example, the description of FIG. 2, above).

Figure 22:
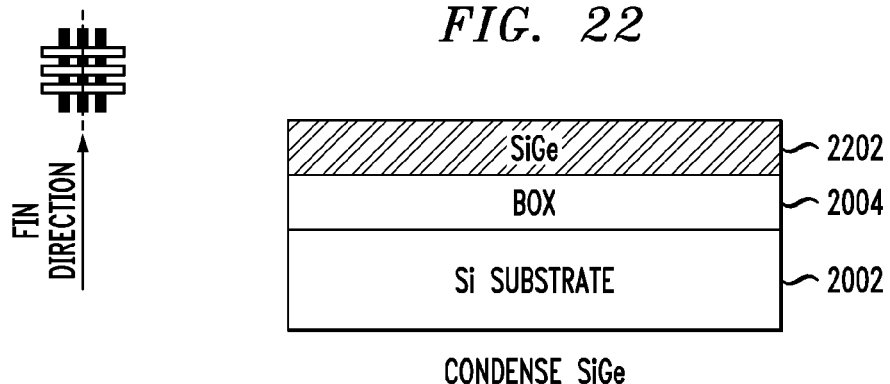
FIG. 22 is a cross-sectional diagram illustrating the SiGe layer having been condensed so as to form a SiGe SOI layer according to an embodiment of the present invention.

Reference to the legend at the top left corner of FIG. 22 shows the orientation of the cross-sectional cut depicted in FIG. 22. Specifically, the orientation of the cross-sectional cut shown in FIG. 22 is along the fin direction.

A Si layer 2302 is then epitaxially grown over SiGe SOI layer 2202. Further, one or more additional sacrificial layers and/or crystalline Si layers may optionally be epitaxially grown in an alternating fashion as a stack on top of the wafer, in which the properties of the additional sacrificial layer(s) are the same as SiGe SOI layer 2202, and the properties of the additional crystalline Si layer(s) are the same as Si layer 2302.

Fin hardmasks 2304 are then formed on the Si layer 2302 (or if additional sacrificial layers and/or crystalline Si layers are formed, then the fin hardmasks 2304 are formed on the topmost Si layer in the stack). According to the exemplary embodiment shown illustrated in FIG. 23, the fin hardmasks are formed from a nitride material.

As described above, the fin hardmasks may be formed by first depositing the hardmask material (for example silicon nitride) onto the Si layer 2302 using, for example, CVD, PECVD or any suitable technique for dielectric deposition that does not induce a physical or chemical change to Si layer 2302. According to an exemplary embodiment, the hardmask material is deposited onto Si layer 2302 to a thickness of from about 15 nm to about 20 nm, e.g., about 20 nm. The deposited hardmask material is then patterned into a plurality of the individual fin hardmasks 2304. The patterning of the hardmasks is commensurate with a desired footprint and location of the fins which, as described above, will be used to form the source, drain and channel regions of the device. According to an exemplary embodiment, a resist film (not shown) is deposited on the hardmask material and patterned with the footprint and location of each of the fin hardmasks 2304. In one example, RIE is used to form the fin hardmasks, and therefore the resist film comprises a resist material such as HSQ patterned using e-beam lithography and transferred to a carbon-based resist.

Figure 23:
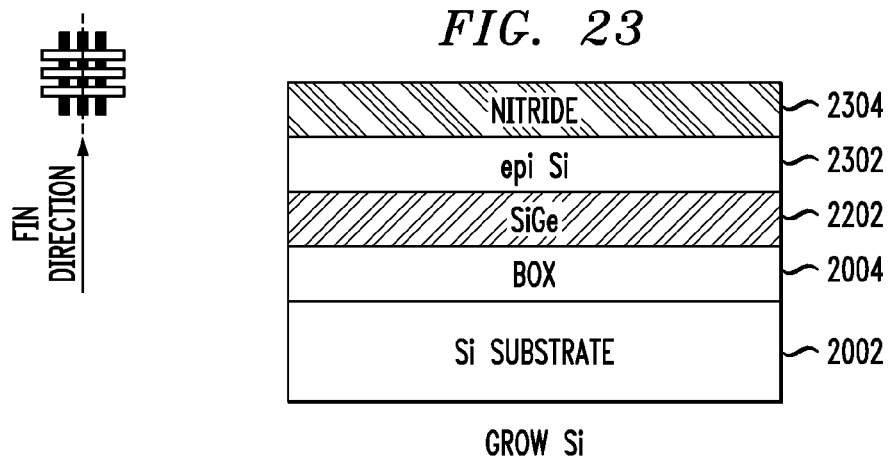
FIG. 23 is a cross-sectional diagram illustrating a Si layer having been epitaxially grown on the SiGe SOI layer and nanowire hardmasks having been formed on the Si layer according to an embodiment of the present invention.

Reference to the legend at the top left corner of FIG. 23 shows the orientation of the cross-sectional cut depicted in FIG. 23. Specifically, the orientation of the cross-sectional cut shown in FIG. 23 is along the fin direction.

Fins are then etched into the Si and sacrificial layers. Portions of the Si layer, once released from the sacrificial layer, will form nanowire channels of the device. In this example the fins stacks are etched into Si layer 2302 and SiGe SOI layer 2202. See FIG. 24. The fins formed in the Si layers, once released from the sacrificial layers as described below, will be the nanowire channels, source and drain regions of the device. According to an exemplary embodiment, a Si-selective RIE is used to remove portions of the Si/sacrificial layers not masked by the fin hardmasks 2304 using the BOX 2004 as an etch stop.

As highlighted above, since the fin etch is being performed at this point in the process, i.e., before the dummy gate/replacement gate steps, this process is also referred to herein as a fin first process. Further, since the nanowire channels formed in the fins will be released from the sacrificial layer after the dummy gate steps, this process is also referred to herein as a wire last process.

Figure 24:
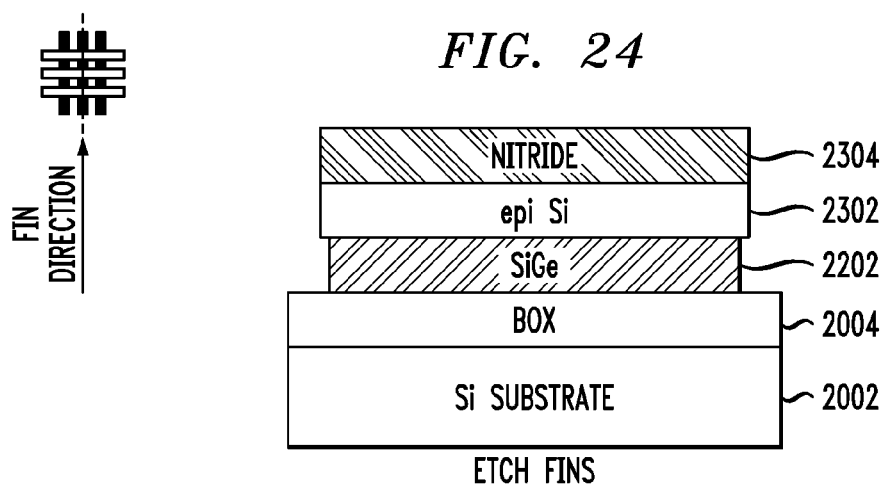
FIG. 24 is a cross-sectional diagram illustrating fin stacks having been etched into the Si layer and the SiGe SOI layer according to an embodiment of the present invention.

Reference to the legend at the top left corner of FIG. 24 shows the orientation of the cross-sectional cut depicted in FIG. 24. Specifically, the orientation of the cross-sectional cut shown in FIG. 24 is along the fin direction.

FIG. 25 depicts the etched fin stacks from another perspective, i.e., as a cross-sectional cut through the gate direction of the device (see the legend at the top left corner of FIG. 25 which shows that the orientation of the cross-sectional cut depicted in FIG. 25 is along the gate direction). FIG. 25 also illustrates exemplary dimensions for the fin stacks. By way of example only, the fin hardmasks 2304 are configured to have a pitch, i.e., a spatial frequency, of less than about 200 nm, for example, from about 10 nm to about 200 nm, e.g., from about 40 nm to about 50 nm. To maximize layout density and minimize parasitic capacitance, the pitch should be as small as possible within patterning and processing limits. To achieve pitches smaller than what can be defined by direct lithography, a pitch doubling technique such as sidewall image transfer or double patterning/double etching can be used. According to an exemplary embodiment, a width 2502, as shown in FIG. 25, of each fin hardmask 2304 is less than about 40 nm, for example, from about five nm to about 40 nm, e.g., from about five nm to about 10 nm. The pitch/width of each fin hardmask 2304 will determine a pitch/width of each nanowire.

Thus, based on the pitch and width of the fin hardmasks 2304, the fins formed have a pitch, i.e., a spatial frequency, of less than about 200 nm, for example, from about 10 nm to about 200 nm, e.g., from about 40 nm to about 50 nm, and a width of less than about 40 nm, for example, from about five nm to about 40 nm, e.g., from about five nm to about 10 nm. The nanowire hardmasks 2304 may also be removed at this stage using, for example, a nitride-selective RIE.

Further, as shown in FIG. 25, the SiGe SOI layer 2202, following the fin etch, is thinner than the Si layer 2302. This is the result of the SiGe being etched laterally during the fin etch. Also, during the oxidation performed before the dummy gate deposition (see below), the SiGe may be consumed slightly more than the Si layer.

Reference to the legend at the top left corner of FIG. 25 shows the orientation of the cross-sectional cut depicted in FIG. 25. Specifically, the orientation of the cross-sectional cut shown in FIG. 25 is along the gate direction.

A dummy gate is then formed surrounding the fins. To form the dummy gate, a dummy gate material 2602 is first blanket deposited onto the wafer covering the fins. See FIG. 26. According to an exemplary embodiment, the dummy gate material 2602 is poly-silicon that is deposited onto the wafer using LPCVD.

Prior to depositing the dummy gate material 2602, an oxide layer may be formed on the exposed surfaces of the fins (labeled "dummy oxide" in FIG. 26). This oxide layer may be formed on the fins using thermal oxidation and may have a thickness of from about 2 nm to about 4 nm. As provided above, during this oxidation step, a bit more of the SiGe may be consumed than the Si layer, thus resulting in a laterally thinner SiGe layer than Si layer, see for example, FIG. 25 above.

The oxide layer is formed to provide an etch stop layer for the dummy gate removal process. For instance, when poly-silicon is used as the dummy gate material, a layer is needed to protect the Si channel during the poly-silicon removal step since there is essentially no etch contrast between poly-silicon and single crystal Si.

Following deposition of the dummy gate material 2602, the dummy gate material 2602 can be planarized using, e.g., CMP. Gate hardmasks 2604 are then formed on the dummy gate material 2602. See FIG. 26. According to the exemplary embodiment shown illustrated in FIG. 26, the gate hardmasks are formed from a nitride material, such as SiN.

The gate hardmasks may be formed by first depositing the hardmask material (for example SiN) onto the dummy gate material 2602 using, for example, CVD or PECVD. According to an exemplary embodiment, the hardmask material is deposited onto the dummy gate material 2602 to a thickness of from about 15 nm to about 20 nm, e.g., about 20 nm. The deposited hardmask material is then patterned into a plurality of the individual gate hardmasks 2604. The patterning of the hardmasks is commensurate with a desired location of the gates of the device. According to an exemplary embodiment, a resist film (not shown) is deposited on the hardmask material and patterned with the footprint and location of each of the gate hardmasks 2604. In one example, RIE is used to form the gate hardmasks, and therefore the resist film comprises a resist material such as HSQ patterned using e-beam lithography and transferred to a carbon-based resist. Gate hardmasks mask the footprint and location of the dummy gate (over what are to be the channel regions of the device).

Reference to the legend at the top left corner of FIG. 26 shows the orientation of the cross-sectional cut depicted in FIG. 26. Specifically, the orientation of the cross-sectional cut shown in FIG. 26 is along the gate direction.

Next, the gate hardmasks 2604 are used to pattern the dummy gate material 2602 into a plurality of individual dummy gates 2702. See FIG. 27. Dummy gates 2702 can be patterned using a poly-silicon selective RIE around the gate hardmasks 2604.

Reference to the legend at the top left corner of FIG. 27 shows the orientation of the cross-sectional cut depicted in FIG. 27. Specifically, the orientation of the cross-sectional cut shown in FIG. 27 is along the gate direction.

Figure 28:
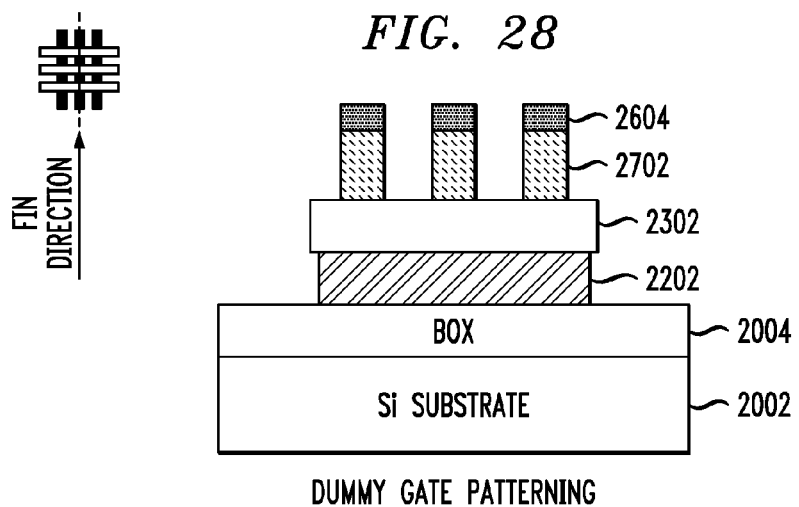
FIG. 28 is a cross-sectional diagram illustrating the patterning of the dummy gates from another perspective, i.e., as a cross-sectional cut through the fin direction of the device through one of the fins, according to an embodiment of the present invention.

FIG. 28 depicts the patterning of dummy gates 2702 from another perspective, i.e., as a cross-sectional cut through the fin direction of the device (see the legend at the top left corner of FIG. 28 which shows that the orientation of the cross-sectional cut depicted in FIG. 28 is along the fin direction). In this depiction, the cross-sectional cut along the fin direction is through one of the fins.

Figure 29:
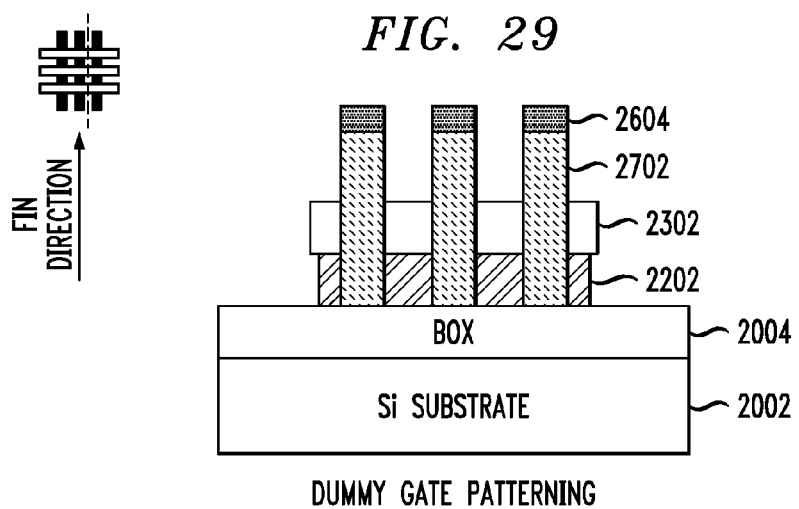
FIG. 29 is a cross-sectional diagram illustrating the patterning of the dummy gates from yet another perspective, i.e., as a cross-sectional cut through the fin direction of the device between two of the fins, according to an embodiment of the present invention.

FIG. 29 depicts the patterning of dummy gates 2702 from yet another perspective, i.e., as a cross-sectional cut through the fin direction of the device (see the legend at the top left corner of FIG. 29 which shows that the orientation of the cross-sectional cut depicted in FIG. 29 is along the fin direction). In this depiction, the cross-sectional cut along the fin direction is between two of the fins.

Spacers 3002 are then formed on opposite sides of the dummy gates 2702. See FIG. 30. Spacers 3002 serve to offset the gate a certain distance from the source/drain regions. According to an exemplary embodiment, spacers 3002 are formed by first depositing a nitride layer onto the wafer, covering the fins. A resist film (not shown) is then deposited on the nitride layer, masked and patterned with a location and footprint of the spacers. A nitride-selective RIE is then used to define spacers 3002 in the nitride layer.

Figure 30:
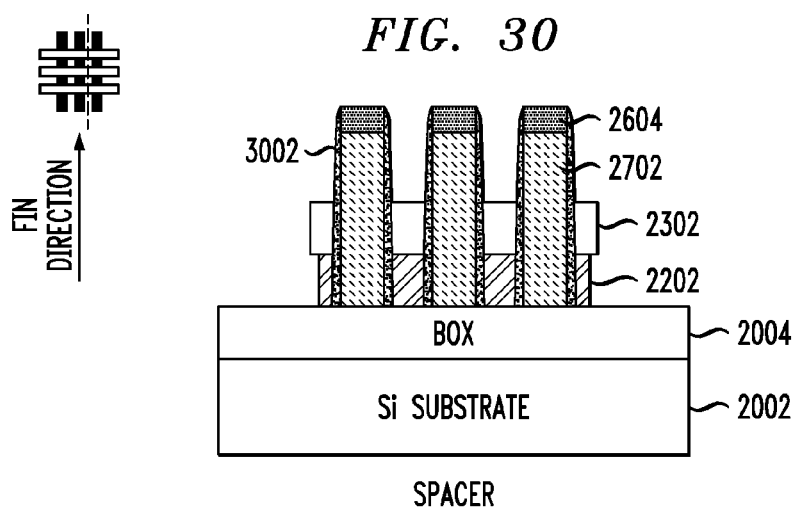
FIG. 30 is a cross-sectional diagram illustrating spacers having been formed on opposite sides of the dummy gates according to an embodiment of the present invention.

Reference to the legend at the top left corner of FIG. 30 shows the orientation of the cross-sectional cut depicted in FIG. 30. Specifically, the orientation of the cross-sectional cut shown in FIG. 30 is along the fin direction. It is notable that in the depiction in FIG. 30, the cross-sectional cut along the fin direction is between two of the fins.

Optionally, next an epitaxy step may be used to form raised source and drain regions (RSD) 3102 on the exposed portions of the fins which will serve as source and drain regions of the device (i.e., the channel regions of the fins are already covered by the dummy gates 2702). See FIG. 31. Epitaxy to form the raised source and drain regions 3102 may be carried out using VPE, MBE or LPE with a gaseous or liquid precursor, such as silicon tetrachloride. The parameters and process for epitaxy to form raised source and drain regions are known to those of skill in the art and thus are not described further herein.

Prior to forming the raised source and drain regions 3102, the source and drain regions of the fins may optionally be doped using, for example, in-situ doping with a suitable source and drain dopant. Suitable source and drain dopants include, but are not limited to, boron and phosphorous.

Figure 31:
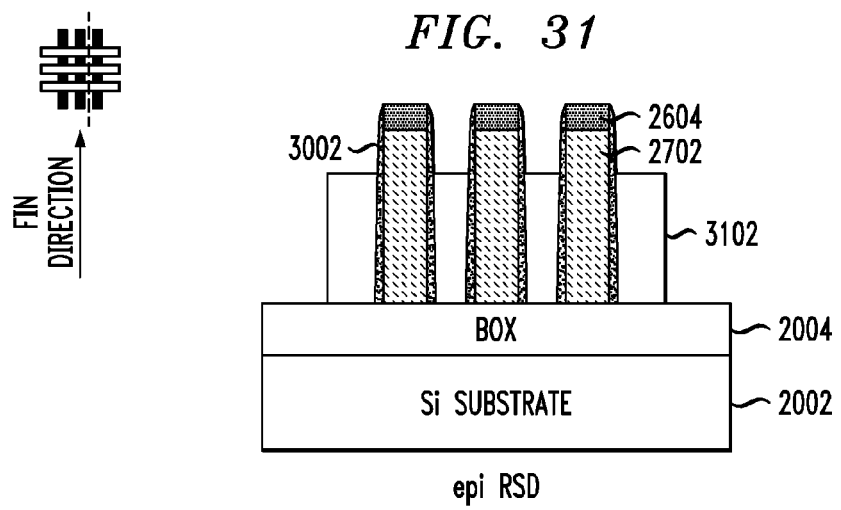
FIG. 31 is a cross-sectional diagram illustrating optional RSD regions having been formed on the exposed (source and drain) regions of the fins according to an embodiment of the present invention.

Reference to the legend at the top left corner of FIG. 31 shows the orientation of the cross-sectional cut depicted in FIG. 31. Specifically, the orientation of the cross-sectional cut shown in FIG. 31 is along the fin direction. It is notable that in the depiction in FIG. 31, the cross-sectional cut along the fin direction is between two of the fins.

A gap filler material 3202 is then deposited onto the wafer, filling the spaces between the fins and between the dummy gates 2702. See FIG. 32. Gap filler material 3202 can include any suitable filler material, including a dielectric material, such as $SiO_2$. According to an exemplary embodiment, gap filler material 3202 is deposited using a high-density plasma (HDP). CMP is then used to planarize the filler material, using the dummy gates 2702 as an etch stop. During this CMP step, any remaining gate hardmasks 2604 are also removed.

Figure 32:
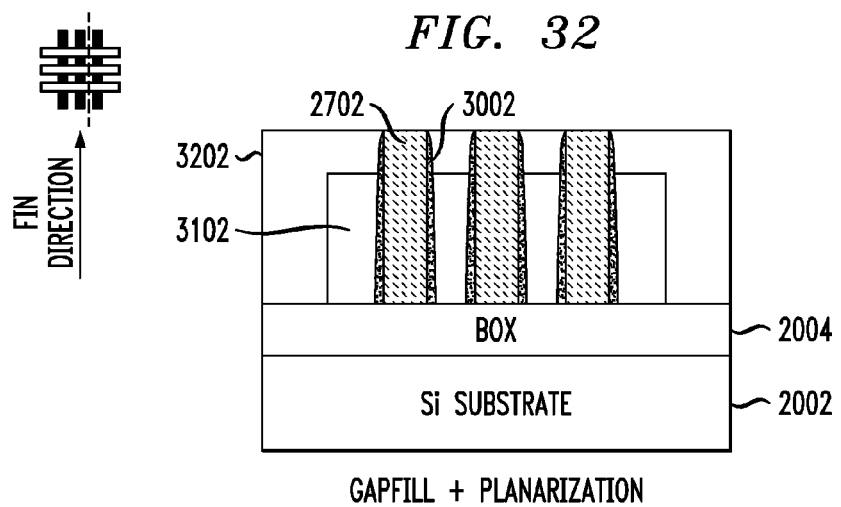
FIG. 32 is a cross-sectional diagram illustrating a gap filler material having been deposited onto the wafer, filling the spaces between the fins and between the dummy gates according to an embodiment of the present invention.

Reference to the legend at the top left corner of FIG. 32 shows the orientation of the cross-sectional cut depicted in FIG. 32. Specifically, the orientation of the cross-sectional cut shown in FIG. 32 is along the fin direction. It is notable that in the depiction in FIG. 32, the cross-sectional cut along the fin direction is between two of the fins.

Figure 33:
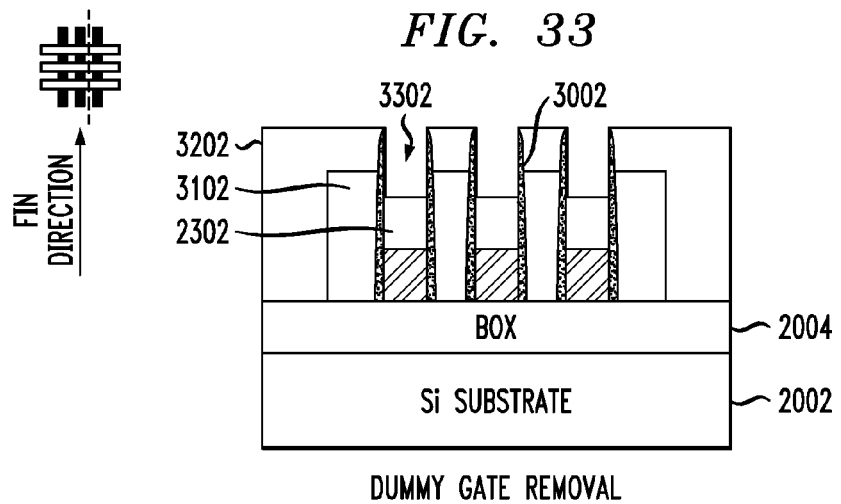
FIG. 33 is a cross-sectional diagram illustrating the dummy gates having been removed selective to the gap filler material according to an embodiment of the present invention.

The dummy gates 2702 are then removed selective to the gap filler material 3202. See FIG. 33. Dummy gates 2702 can be removed using a chemical etching process, such as chemical down stream or KOH etching, or RIE. As shown in FIG. 33, removal of dummy gates 2702 results in a trench 3302 being formed in gap filler material 3202. According to an exemplary embodiment, trench 3302 distinguishes a (nanowire) channel region of the device from source and drain regions of the device.

Reference to the legend at the top left corner of FIG. 33 shows the orientation of the cross-sectional cut depicted in FIG. 33. Specifically, the orientation of the cross-sectional cut shown in FIG. 33 is along the fin direction. It is notable that in the depiction in FIG. 33, the cross-sectional cut along the fin direction is between two of the fins.

FIG. 34 depicts the removal of the dummy gates 2702 from another perspective, i.e., as a cross-sectional cut through the fin direction of the device (see the legend at the top left corner of FIG. 34 which shows that the orientation of the cross-sectional cut depicted in FIG. 34 is along the fin direction). It is notable that in the depiction in FIG. 34, the cross-sectional cut along the fin direction is through one of the fins.

As provided above, the Si layer 2302 will form nanowire channels of the device. In order to be able to form a gate (a replacement gate, see below) that surrounds the nanowire channels, the nanowire channels have to be released from the fin. Namely, the (sacrificial) SiGe SOI layer 2202 is removed from the fin, resulting in a suspended nanowire formed from Si layer 2302. See FIG. 35. Further, as provided above, more Si and sacrificial layers than what are shown in the figures may be implemented in the same manner as described above, except that in the initial stages of the process, additional Si and sacrificial layers would be formed in the stack (see above). In that case, multiple layers of suspended nanowire channels would be formed in this step. These multiple layers of nanowire channels are commonly referred to as a nanowire "mesh."

The sacrificial layers may be removed from the fin stack as follows. A chemical etchant can be employed that exploits the lower oxidation potential of the sacrificial layers as compared to the Si layers. Examples of such etchants include, but are not limited to a 1:2:3 mixture of HF:hydrogen peroxide ($H_2O_2$): acetic acid ($CH_3COOH$), or a mixture of sulfuric acid ($H_2SO_4$) and $H_2O_2$. Alternatively, the sacrificial layers can be selectively removed using a dry etching process such as oxygen ($O_2$) plasma etching or plasma chemistries typically used for etching.

Reference to the legend at the top left corner of FIG. 35 shows the orientation of the cross-sectional cut depicted in FIG. 35. Specifically, the orientation of the cross-sectional cut shown in FIG. 35 is along the fin direction. It is notable that in the depiction in FIG. 35, the cross-sectional cut along the fin direction is between two of the fins.

FIG. 36 depicts the release of the nanowire channels from the fin stacks from another perspective, i.e., as a cross-sectional cut through the fin direction of the device (see the legend at the top left corner of FIG. 36 which shows that the orientation of the cross-sectional cut depicted in FIG. 36 is along the fin direction). It is notable that in the depiction in FIG. 36, the cross-sectional cut along the fin direction is through one of the fins.

Replacement gates 3702 are then formed in the trenches 3302 surrounding the nanowire channels. See FIG. 37. The replacement gates 3702 are formed by first filling the trenches 3302 with a gate material. Once the gate material is filled into trenches 3302, CMP is used to planarize the gate material. Suitable gate materials include, but are not limited to, one or more of polysilicon, a deposited metal(s). (such as titanium nitride (TiN)) and a hybrid stack of multiple materials such as metal polysilicon.

Prior to the formation of the replacements gates 3702, a gate dielectric material is preferably first deposited surrounding the nanowire channels. According to an exemplary embodiment, the gate dielectric material employed is a high-k material, such as hafnium oxide, that is deposited using a conformal deposition process such as atomic layer deposition (ALD). High-k dielectrics are particularly well suited for this gate all around process flow due to the need for a small equivalent oxide thickness for performance and electrostatic control reasons and also the need for a relatively large physical thickness to fill gaps underneath the spacers. See below.

Figure 37:
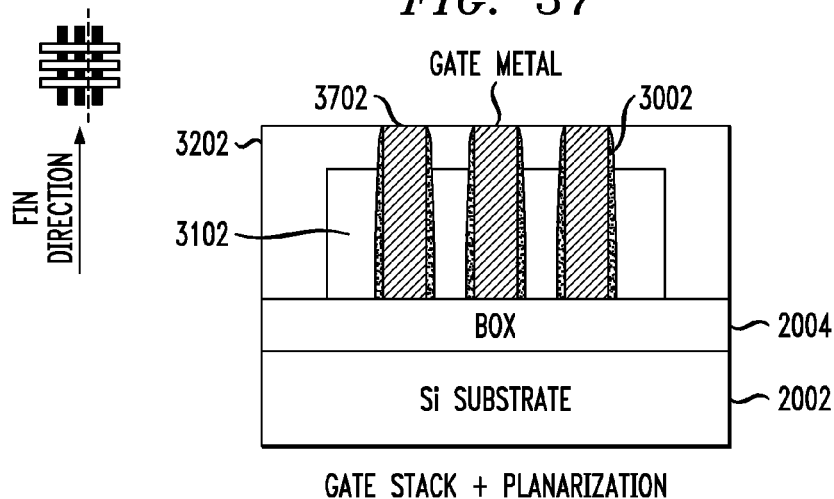
FIG. 37 is a cross-sectional diagram illustrating replacement gates having been formed in the trenches formed by removal of the dummy gates according to an embodiment of the present invention.

Reference to the legend at the top left corner of FIG. 37 shows the orientation of the cross-sectional cut depicted in FIG. 37. Specifically, the orientation of the cross-sectional cut shown in FIG. 37 is along the fin direction. It is notable that in the depiction in FIG. 37, the cross-sectional cut along the fin direction is between two of the fins.

Figure 38:
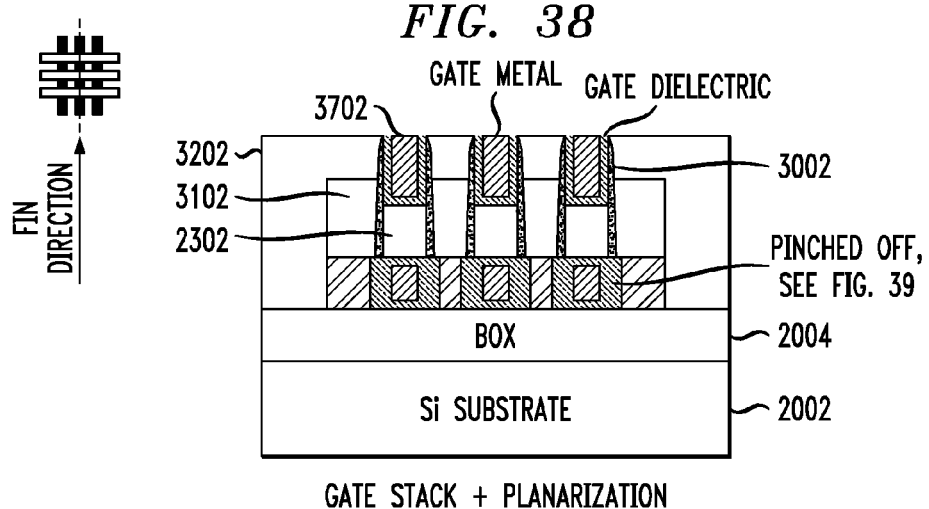
FIG. 38 is a cross-sectional diagram illustrating formation of the replacement gates from another perspective, i.e., as a cross-sectional cut through the fin direction of the device through one of the fins according to an embodiment of the present invention.

FIG. 38 depicts the formation of the replacement gates 3702 from another perspective, i.e., as a cross-sectional cut through the fin direction of the device (see the legend at the top left corner of FIG. 38 which shows that the orientation of the cross-sectional cut depicted in FIG. 38 is along the fin direction). It is notable that in the depiction in FIG. 38, the cross-sectional cut along the fin direction is through one of the fins. As illustrated in FIG. 38, a gate dielectric may be formed on exposed portions of the fins prior to deposition of the replacement gate material. This gate dielectric may be formed using a thermal oxidation process, see above.

Figure 39:
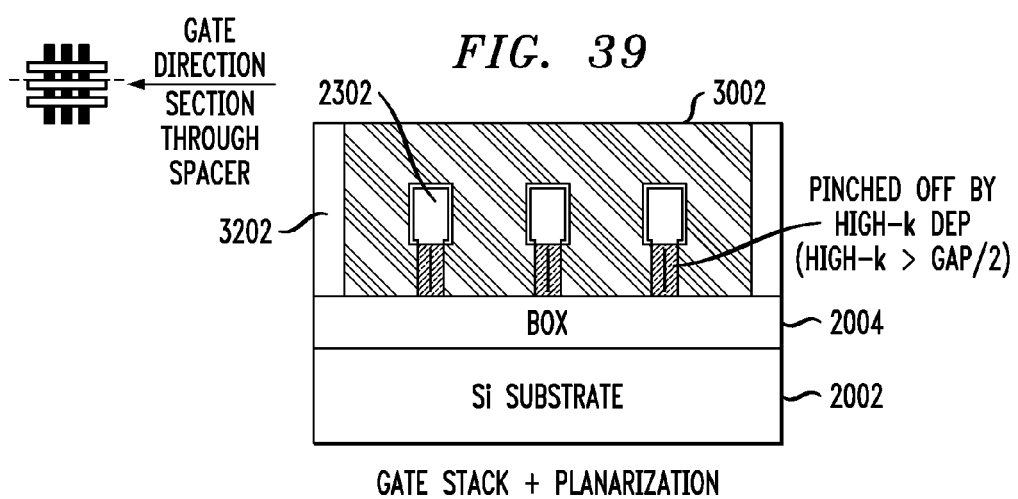
FIG. 39 is a cross-sectional diagram illustrating formation of the replacement gates from another perspective, i.e., as a cross-sectional cut through the gate direction of the device through one of the spacers according to an embodiment of the present invention.

FIG. 39 depicts the formation of the replacement gates 3702 from yet another perspective, i.e., as a cross-sectional cut through the gate direction of the device (see the legend at the top left corner of FIG. 39 which shows that the orientation of the cross-sectional cut depicted in FIG. 39 is along the gate direction). It is notable that in the depiction in FIG. 39, the cross-sectional cut along the gate direction is through one of the spacers 3002. Since the spacers are formed prior to the nanowire channel release from the fins (see above), once the sacrificial material is removed from the fins, a gap is left in the spacers under the nanowire channel. If that gap were to be left open (i.e., not filled with dielectric), then the replacement gate material would fill the gap. This extra bit of gate material will increase the harmful parasitic capacitance of the gate to the source and drain regions.

Thus, as shown in FIG. 39, the gate dielectric is used to fill that gap. As provided above, the gate dielectric employed is preferably a high-k dielectric deposited using a conformal process, such as ALD. Thus, in order to "pinch-off" the gap (see FIG. 39), the thickness of the (high-k) gate dielectric as deposited needs to be greater than half of the width of the gap (alternatively stated, the gap width needs to be less than 2 times the dielectric thickness). That way the gap will be completely filled by the dielectric and the gate metal will not get into the gap. At practical dimensions this is only achievable with high-k dielectric because we require a small equivalent oxide thickness (EOT) for performance and electrostatic control reasons, but we require a relatively large physical thickness to fill the gap. FIG. 40 is a cross-sectional diagram illustrating formation of the replacement gates from another perspective, i.e., as a cross-sectional cut through the gate direction of the device through one of the gates FIGS. 41-50 are three-dimensional diagrams illustrating the present fabrication process flow with regard to the exemplary SiGe SOI embodiment (see description of FIGS. 20-40, above) from the perspective of a simulated region where one of the fins and one of the gates intersect. See, for example, the legend provided to the upper left of FIGS. 41-50. For ease and clarity of description, the same numbering from the description of FIGS. 20-40 will be used in the description of FIGS. 41-50, and thus like structures are numbered alike. Further, it is notable that only a selection of the above-described steps are illustrated in FIGS. 41-50.

FIG. 41 illustrates the fin etch step. The details of the fin etch were provided in conjunction with the description of FIGS. 24 and 25, above. FIG. 42 illustrates the dummy gate formation step. The details of the dummy gate formation were provided in conjunction with the description of FIGS. 27-29, above.

FIG. 43 illustrates the spacer formation step. The details of the spacer formation were provided in conjunction with the description of FIG. 30, above. FIG. 44 illustrates the raised source and drain (RSD) step. The details of the RSD formation were provided in conjunction with the description of FIG. 31, above.

FIG. 45 illustrates the step of depositing a gap filler material that fills the spaces between the fins and between the dummy gates. The details of the gap filler material step were provided in conjunction with the description of FIG. 32, above. FIG. 46 illustrates the dummy gate removal step. The details of the dummy gate removal were provided in conjunction with the description of FIGS. 33 and 34, above.

FIG. 47 illustrates the step of releasing the nanowire (note how the SiGe SOI (sacrificial) layer 2004 is removed from under the Si layer 2302). The details of the nanowire release step were provided in conjunction with the description of FIGS. 35 and 36, above. FIG. 48 illustrates the formation of the replacement gate (in this case, the replacement gate is formed from titanium nitride (TiN)). The details of the replacement gate formation step were provided in conjunction with the description of FIGS. 37-40, above.

FIG. 49 illustrates a completed device structure after replacement gate formation. In FIG. 50, the replacement gate has been removed, for illustrative purposes only, to show the nanowire channel and how the nanowire channel is surrounded by the replacement gate (a gate all around) device.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of fabricating a nanowire field-effect transistor (FET) device, comprising the steps of:
   providing a wafer;
   forming at least one sacrificial layer and at least one silicon layer on the wafer in a stack, wherein the sacrificial layer comprises an epitaxial crystalline material which can be etched selectively to silicon;
   patterning a plurality of fins in the stack by patterning the sacrificial layer and the silicon layer to form the fins;
   forming a plurality of dummy gates over one or more first portions of the fins which will serve as channel regions of the FET device, and wherein one or more second portions of the fins which remain exposed after the step of forming the dummy gates has been performed will serve as source and drain regions of the FET device;
   depositing a gap filler material surrounding the dummy gates;
   planarizing the gap filler material;
   removing the dummy gates selective to the gap filler material so as to form trenches in the gap filler material;
   releasing portions of the silicon layer from the fins within the trenches by removing from the fins only those portions of the sacrificial layer that were patterned to form the fins and that are present within the trenches, wherein the portions of the silicon layer released within the trenches will serve as nanowire channels of the FET device and by way of the releasing step only the nanowire channels are released from the fins; and
   forming a plurality of replacement gates within the trenches that surround the nanowire channels of the FET device in a gate all around configuration.

2. The method of claim 1, wherein the wafer is a bulk silicon wafer.

3. The method of claim 2, further comprising the step of:
   depositing a shallow trench isolation (STI) oxide material around a base portion of each of the fins.

4. The method of claim 1, wherein the wafer is a semiconductor-on-insulator (SOI) wafer having an SOI layer separated from a substrate by a buried oxide (BOX).

5. The method of claim 4, further comprising the steps of:
   providing the SOI wafer, wherein the SOI layer comprises silicon;
   forming a silicon germanium layer on the SOI layer; and
   condensing the silicon germanium layer to drive germanium from the silicon germanium layer into the SOI layer, thereby resulting in the SOI layer comprising silicon germanium.

6. The method of claim 5, wherein the SOI layer comprising silicon germanium forms the sacrificial layer.

7. The method of claim 1, wherein the sacrificial layer comprises silicon germanium.

8. The method of claim 1, wherein the silicon layer is epitaxially grown on the sacrificial layer.

9. The method of claim 1, wherein the step of patterning a plurality of fins in the stack comprises the steps of:
   forming a hardmask on the stack which masks a footprint and location of the fins; and
   using the hardmask to pattern the fins in the stack.

10. The method of claim 1, wherein the step of forming a dummy gate comprises the steps of:
    depositing a dummy gate material surrounding the fins;
    planarizing the dummy gate material;
    forming a hardmask on the dummy gate material which masks a footprint and location of the dummy gates; and
    using the hardmask to pattern the dummy gates.

11. The method of claim 10, wherein the dummy gate material comprises poly-silicon.

12. The method of claim 1, further comprising the steps of:
    forming spacers on opposite sides of the dummy gates;
    after portions of the silicon layer have been released from the fins which results in a gap left in the spacers under the nanowire channels, completely filling the gap with a gate dielectric material.

13. The method of claim 1, further comprising the step of:
    epitaxially forming raised source and drain regions on the one or more second portions of the fins which will serve as source and drain regions of the FET device.

14. The method of claim 13, further comprising the step of:
doping the one or more second portions of the fins which will serve as source and drain regions of the FET device prior to performing the step of epitaxially forming the raised source and drain regions.

15. The method of claim 1, wherein the gap filler material comprises a dielectric.

16. The method of claim 1, wherein the step of forming the replacement gates comprises the steps of:
depositing a replacement gate material into the trenches surrounding the nanowire channels of the FET; and
planarizing the replacement gate material.

17. The method of claim 16, wherein the replacement gate material comprises at least one metal or poly-silicon.

18. A FET device, comprising:
a plurality of fins formed on a wafer, wherein each of the fins comprises at least one sacrificial layer and at least one silicon layer in a stack which have been patterned into fins and which serve as source and drain regions of the FET device, wherein the sacrificial layer comprises an epitaxial crystalline material which has etch selectivity to silicon, and wherein portions of the silicon layer released from the fin form nanowire channels of the FET device, and wherein only the nanowire channels are released from the fins;
a gap filler material surrounding the fins; and
a plurality of gates, formed within trenches in the gap filler material, that surround the nanowire channels of the FET device in a gate all around configuration.

19. The FET device of claim 18, wherein the wafer is a bulk silicon wafer.

20. The FET device of claim 18, wherein the wafer is a SOI wafer having an SOI layer separated from a substrate by a BOX.

21. The FET device of claim 18, wherein the sacrificial layer comprises silicon germanium.

22. The FET device of claim 20, wherein the SOI layer comprises silicon germanium and forms the sacrificial layer.

23. The FET device of claim 18, further comprising:
spacers on opposite sides of the gates; and
a gate dielectric material completely filling a gap in the spacers under the nanowire channels.

24. The FET device of claim 18, further comprising:
epitaxially raised source and drain regions formed on the source and drain regions of the FET device.

25. The FET device of claim 18, wherein the gap filler material comprises a dielectric.

26. The FET device of claim 18, wherein the gates comprise at least one metal or poly-silicon.

* * * * *